United States Patent
Oldridge et al.

(10) Patent No.: US 11,277,094 B2
(45) Date of Patent: Mar. 15, 2022

(54) PHOTOVOLTAIC ASSEMBLY

(71) Applicant: FLISOM AG, Niederhasli (CH)

(72) Inventors: John Oldridge, Zurich (CH); Thomas Netter, Winterthur (CH); Roland Kern, Buelach (CH)

(73) Assignee: FLISOM AG, Niederhasli (CH)

( * ) Notice: Subject to any disclaimer, the term of this patent is extended or adjusted under 35 U.S.C. 154(b) by 0 days.

(21) Appl. No.: 16/082,893

(22) PCT Filed: Feb. 23, 2017

(86) PCT No.: PCT/IB2017/000172
§ 371 (c)(1),
(2) Date: Sep. 6, 2018

(87) PCT Pub. No.: WO2017/153830
PCT Pub. Date: Sep. 14, 2017

(65) Prior Publication Data
US 2019/0081592 A1    Mar. 14, 2019

Related U.S. Application Data

(60) Provisional application No. 62/305,486, filed on Mar. 8, 2016.

(51) Int. Cl.
*H02S 40/36* (2014.01)
*H01L 31/048* (2014.01)
(Continued)

(52) U.S. Cl.
CPC ............ *H02S 40/36* (2014.12); *H01L 27/142* (2013.01); *H01L 31/046* (2014.12);
(Continued)

(58) Field of Classification Search
None
See application file for complete search history.

(56) References Cited

U.S. PATENT DOCUMENTS 4,773,944 A * 9/1988 Nath ................. B32B 17/10788
136/249
5,697,192 A 12/1997 Inoue
(Continued)

FOREIGN PATENT DOCUMENTS

| JP | 08187513 A | * | 7/1996 |
| JP | 2004-146435 A | | 5/2004 |
| WO | 2012/104299 A2 | | 8/2012 |

OTHER PUBLICATIONS

Partial machine translation of Yoshida JP 08187513 A (Year: 2020).*

*Primary Examiner* — Golam Mowla
(74) *Attorney, Agent, or Firm* — Patterson & Sheridan, LLP

(57) ABSTRACT

A photovoltaic apparatus is provided including a first portion having a first surface facing a first direction; a second portion located in a different position in the first direction from the first portion; and a third portion located in a different position in the first direction from the first portion; a front sheet and a back sheet each extending at least partially through each of the first portion, the second portion, and the third portion. The photovoltaic apparatus further includes a first rigid folded portion connecting the first portion to the second portion, the first rigid folded portion including portions of the front sheet and the back sheet; and a second rigid folded portion connecting the first portion to the third portion, the second rigid folded portion including portions of the front sheet and the back sheet.

25 Claims, 6 Drawing Sheets

(51) Int. Cl.
*H01L 31/046* (2014.01)
*H01L 31/049* (2014.01)
*H02S 20/23* (2014.01)
*H01L 27/142* (2014.01)

(52) U.S. Cl.
CPC .......... *H01L 31/048* (2013.01); *H01L 31/049* (2014.12); *H01L 31/0481* (2013.01); *H02S 20/23* (2014.12); *Y02E 10/50* (2013.01)

(56) References Cited

U.S. PATENT DOCUMENTS

| | | | |
|---|---|---|---|
| 6,288,324 B1* | 9/2001 | Komori | B32B 27/08 |
| | | | 136/244 |
| 6,310,281 B1* | 10/2001 | Wendt | H01L 31/03925 |
| | | | 136/256 |
| 6,311,436 B1* | 11/2001 | Mimura | E04D 1/365 |
| | | | 52/173.3 |
| 2003/0005954 A1* | 1/2003 | Emoto | H01L 31/048 |
| | | | 136/244 |
| 2004/0171187 A1* | 9/2004 | Kataoka | H01L 31/048 |
| | | | 438/64 |
| 2005/0284515 A1* | 12/2005 | Stevens | H02S 40/34 |
| | | | 136/251 |
| 2012/0138120 A1* | 6/2012 | Fernandez | H01L 31/02 |
| | | | 136/246 |
| 2012/0240982 A1* | 9/2012 | Corneille | H01L 31/0488 |
| | | | 136/251 |
| 2013/0125482 A1* | 5/2013 | Kalkanoglu | H02S 30/10 |
| | | | 52/173.3 |
| 2015/0136207 A1* | 5/2015 | Giron | B62D 29/043 |
| | | | 136/251 |

* cited by examiner

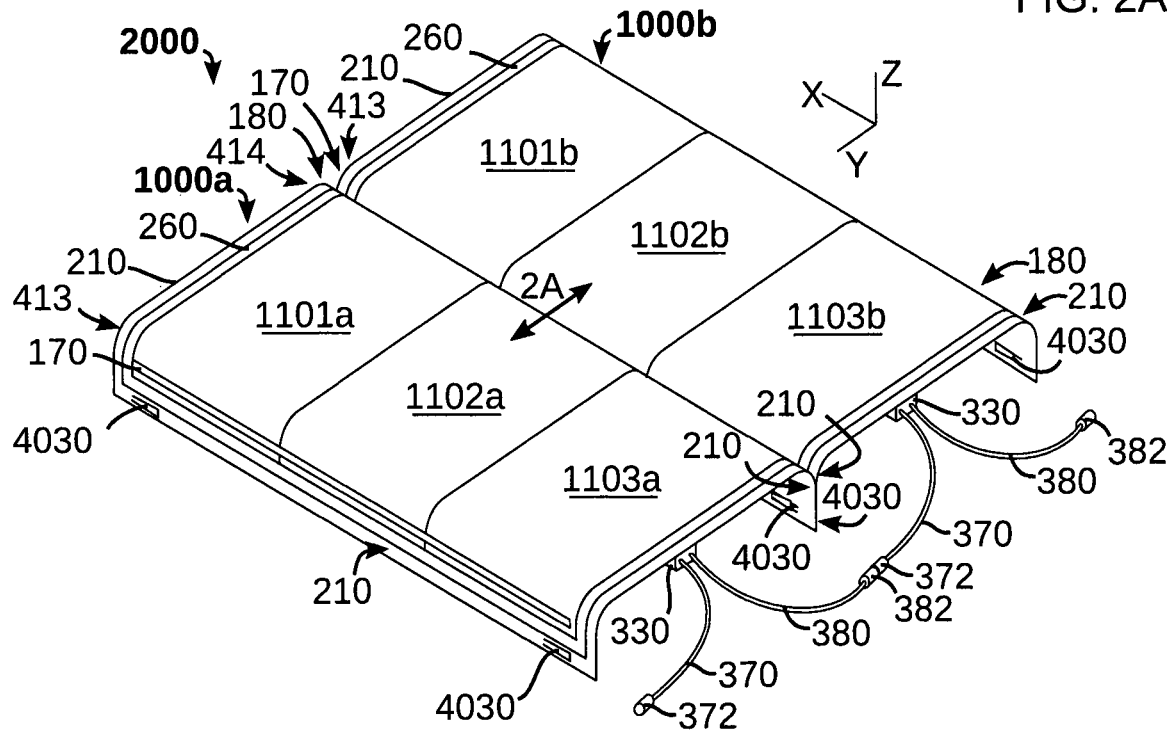
FIG. 2A
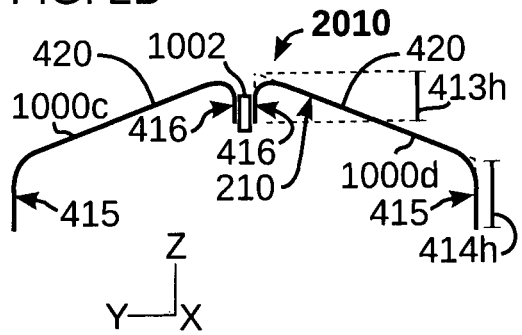
FIG. 2B
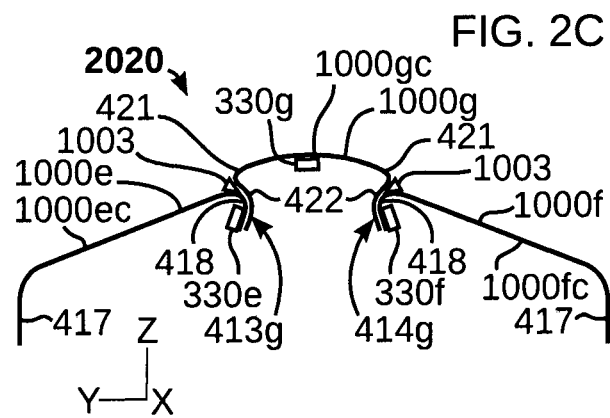
FIG. 2C
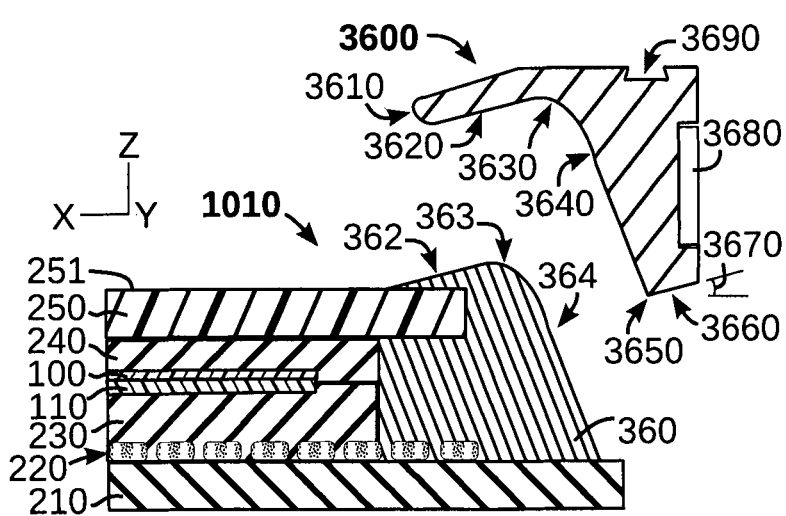
FIG. 3A
FIG. 3B

PHOTOVOLTAIC ASSEMBLY

BACKGROUND

Field

Embodiments of the present disclosure generally relate to arrangements of photovoltaic apparatuses.

Description of the Related Art

The active photovoltaic areas of photovoltaic apparatuses are often surrounded by supporting frames that can be used to route electrical connections and seal the photovoltaic apparatuses from the environment. These supporting frames represent inactive areas of photovoltaic apparatuses that do not produce energy. When multiple photovoltaic modules are arranged across a supporting structure (e.g., a roof), the photovoltaic modules are often positioned so that there is only a small gap between the frames of adjacent photovoltaic modules or the frames can alternatively contact each other to minimize the inactive photovoltaic areas on the supporting structure. However, even when photovoltaic modules contact each other, there is still a significant amount of area of the supporting structure that is not used to produce energy due to the area covered by the frames, which are inactive photovoltaic areas. Thus, there is a continuing need to reduce the amount of non-energy producing area within a photovoltaic module. These non-energy producing areas may include areas that are used to mount the supporting structures to a surface of a supporting element within a photovoltaic installation.

Therefore, there is a need for a photovoltaic apparatus that solves one or more of the problems described above.

SUMMARY

Embodiments of the present disclosure generally relate to arrangements of photovoltaic apparatuses. In one embodiment, a photovoltaic apparatus is provided including a first portion having a first surface facing a first direction; a second portion located in a different position in the first direction from the first portion; and a third portion located in a different position in the first direction from the first portion; a front sheet and a back sheet each extending at least partially through each of the first portion, the second portion, and the third portion. The photovoltaic apparatus further includes a first rigid folded portion connecting the first portion to the second portion, the first rigid folded portion including portions of the front sheet and the back sheet; and a second rigid folded portion connecting the first portion to the third portion, the second rigid folded portion including portions of the front sheet and the back sheet. The photovoltaic apparatus further includes one or more photovoltaic devices disposed between the front sheet and the back sheet, wherein at least a portion of one of the one or more photovoltaic devices is positioned within the first portion, one or more of the second portion or the third portion, and one or more of the first rigid folded portion or the second rigid folded portion, and each of the one or more photovoltaic devices includes an array of photovoltaic cells. The photovoltaic apparatus further includes a first busbar disposed in the second portion and electrically connected to at least one of the one or more photovoltaic devices.

In another embodiment, a photovoltaic apparatus is provided including a first photovoltaic module and a second photovoltaic module. Each photovoltaic module includes a first portion having a first surface facing a first direction; a second portion located in a different position in the first direction from the first portion; and a third portion located in a different position in the first direction from the first portion; a front sheet and a back sheet each extending at least partially through each of the first portion, the second portion, and the third portion. Each photovoltaic module further includes a first rigid folded portion connecting the first portion to the second portion, the first rigid folded portion including portions of the front sheet and the back sheet; and a second rigid folded portion connecting the first portion to the third portion, the second rigid folded portion including portions of the front sheet and the back sheet. Each photovoltaic module further includes one or more photovoltaic devices disposed between the front sheet and the back sheet, wherein at least a portion of one of the one or more photovoltaic devices is positioned within the first portion, one or more of the second portion or the third portion, and one or more of the first rigid folded portion or the second rigid folded portion, and each of the one or more photovoltaic devices includes an array of photovoltaic cells. Each photovoltaic module further includes a first busbar disposed in the second portion and electrically connected to at least one of the one or more photovoltaic devices. Each photovoltaic module further includes a second busbar disposed in the third portion and electrically connected to at least one of the one or more photovoltaic devices.

In another embodiment, a method of forming a photovoltaic apparatus is provided. The method includes forming a photovoltaic assembly by placing a photovoltaic device including an array of photovoltaic cells over a back sheet, placing a first busbar at a first end of the array of photovoltaic cells and a second busbar at a second end of the array of photovoltaic cells, and placing a front sheet over the photovoltaic device. The method further includes bending the photovoltaic assembly to form a first rigid folded portion and a second rigid folded portion, wherein first rigid folded portion connects a first portion of the photovoltaic assembly to a second portion of the photovoltaic assembly; the second rigid folded portion connects the first portion of the photovoltaic assembly to a third portion of the photovoltaic assembly; the first portion has a first surface facing a first direction; the second portion is located in a different position in the first direction from the first portion; the third portion is located in a different position in the first direction from the first portion; at least a portion of the first busbar is disposed in the first portion; and at least a portion of the second busbar is disposed in the third portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2A is a top perspective view of photovoltaic apparatus, according to another embodiment.

FIG. 2B is a side schematic view of a photovoltaic apparatus, according to another embodiment.

FIG. 2C is a side schematic view of a photovoltaic apparatus, according to another embodiment.

FIG. 3A is a side cross-sectional view of a photovoltaic apparatus, according to another embodiment.

FIG. 3B is a side cross-sectional view of an edge seal reshaping tool, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a photovoltaic module and arrangements of photovoltaic modules.

Embodiments of the present disclosure generally relate to an arrangement of photovoltaic modules that can be mounted on or connected to a supporting surface, such as a roof, building façade, wall or shading structure of a photovoltaic installation. Embodiments of the present disclosure generally include the structure of a photovoltaic module and a method of forming the same.

Figure 1A:
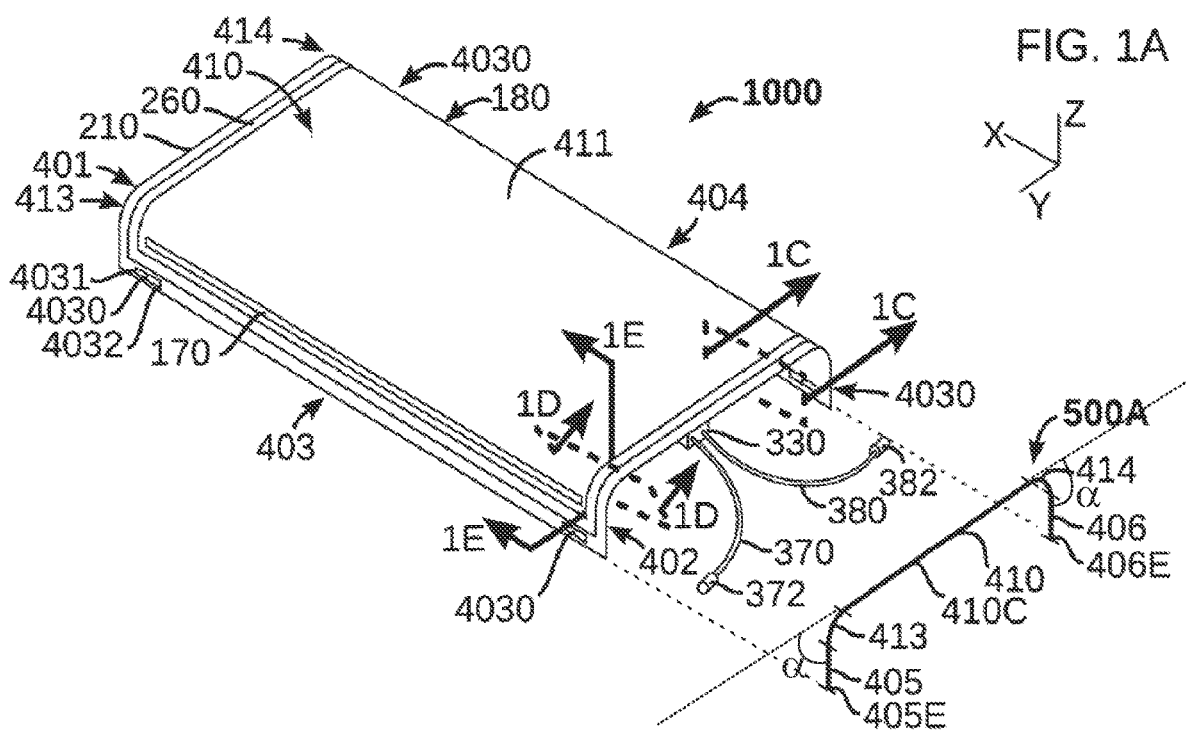
FIG. 1A is a top perspective view of a folded photovoltaic apparatus, according to one embodiment.
Figure 1B:
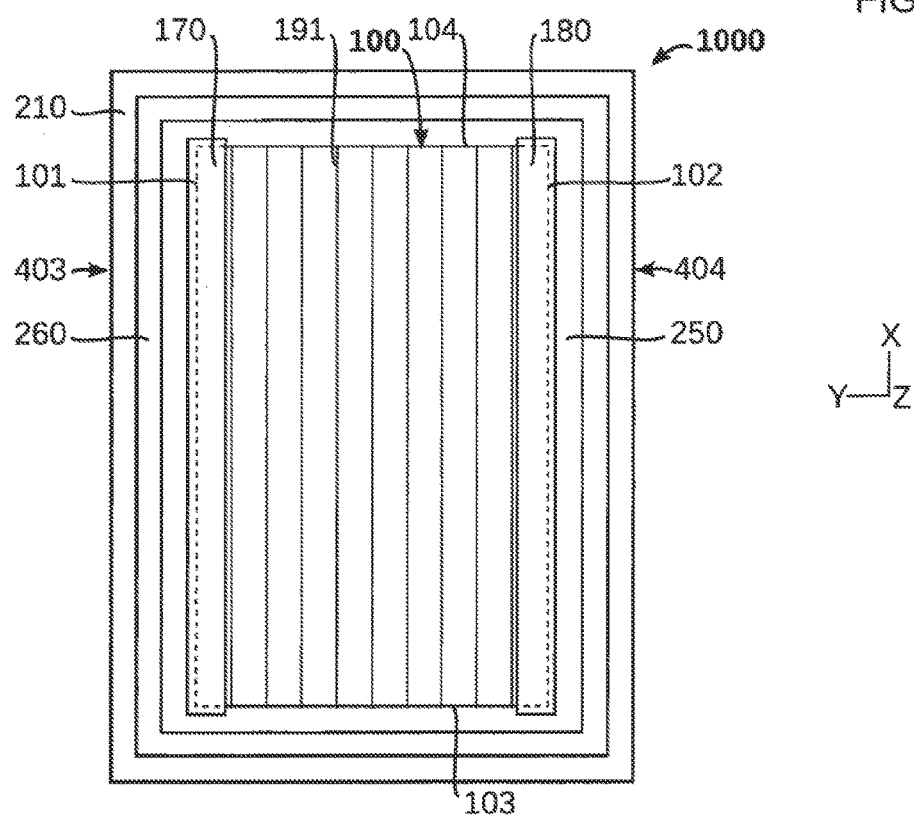
FIG. 1B is a top schematic view of the photovoltaic apparatus of FIG. 1A prior to a folding process performed on the photovoltaic apparatus, according to one embodiment.

FIG. 1A is a top perspective view of a folded photovoltaic apparatus 1000, according to one embodiment. The photovoltaic apparatus 1000 may include multiple optoelectronic devices, such as photovoltaic devices, diodes, and LEDs. The photovoltaic apparatus 1000 is shown including one photovoltaic device 100 (FIG. 1B), or sub-module, that can include multiple photovoltaic cells 105 (FIG. 1B).

The photovoltaic apparatus 1000 includes a first side 401 and a second side 402. The first side 401 is spaced apart from the second side 402 in the X-direction. The photovoltaic apparatus further includes a first end 403 and a second end 404. The first end 403 is spaced apart from the second end 404 in the Y-direction. The photovoltaic apparatus 1000 includes a first rigid folded portion 413 folded around the X-axis at the first end 403 of the photovoltaic apparatus 1000. The photovoltaic apparatus 1000 further includes a second rigid folded portion 414 folded around the X-axis at the second end 404 of the photovoltaic apparatus 1000. As will be described in further detail below, the folded portions 413, 414 may be rigid, which enables the photovoltaic apparatus 1000 to be quickly installed in orientations that place less active areas of the photovoltaic apparatus 1000, such as areas covered by the busbars, at locations that receive less light than the more active areas of the photovoltaic apparatus 1000. Furthermore, the advantages offered by the rigid folded portions 413, 414 enable multiple photovoltaic apparatuses 1000 to be installed next to each other in such a way that the less active areas of the multiple photovoltaic apparatuses 1000 are placed at locations that receive less light than the active areas of the photovoltaic apparatuses 1000 while the less active areas of the photovoltaic apparatuses 1000 only cover a very small percentage of a surface supporting the photovoltaic apparatuses, such as a roof.

Cutaway 500A in the lower right-hand corner of FIG. 1A illustrates how the rigid folded portions 413, 414 divide the photovoltaic apparatus into separate portions. For example, the first rigid folded portion 413 connects a first portion 410 to the second portion 405. The second rigid folded portion 414 connects the first portion 410 to a third portion 406. The first portion 410 has a first surface 411 facing the Z-direction (first direction). The photovoltaic apparatus 1000 can be positioned on a supporting surface (e.g., a roof), so that the first portion 410 can face a direction with the most light exposure. Although the first portion 410 is largely shown as being substantially horizontal having a flat, light-exposed surface, in some embodiments the light-exposed surface of the first portion 410 can be a curved surface, a convex surface, a concave surface, or a wavy surface.

The second portion 405 can be located in a different position in the Z-direction from the first portion 410. The third portion 406 can also be located in a different position in the Z-direction from the first portion 410. The second portion 405 and the third portion 406 can represent portions of the photovoltaic apparatus 1000 that are less active (i.e., portions that generate less photovoltaic energy per unit area) than the first portion 410. As will be described below, the second portion 405 and the third portion 406 each include a busbar for making electrical connections to one or more of the photovoltaic devices, and these busbars can block light which reduces the amount of photovoltaic energy that can be produced in the second portion 405 and the third portion 406. In some embodiments, the first surface 411 can be substantially flat and the second portion 405 and the third portion 406 can each be substantially perpendicular to the first surface 411. In some embodiments, the first surface 411 can be substantially flat and the second portion 405 and the third portion 406 can each be positioned at an angle to the first surface 411, such as at an exterior angle α (shown in FIG. 1A) greater than 85° to a plane that is parallel to the first surface, or an exterior angle α (shown in FIG. 1A) greater than or equal to 90° to a plane that is parallel to the first surface.

In some embodiments, the rigid folded portions 413, 414 can be replaced by a folded portion having a clearly defined corner, such that the first portion 410 can meet the first rigid folded portion 413 or second rigid folded portion 414 at a corner without any noticeable curve. The folded portions 413, 414 can form a curve that extends in both the Y and Z-directions. In some embodiments, the second portion 405 and the third portion 406 can extend substantially in a vertical plane (e.g., a unitless slope>8.5 while still possibly including one or more curves), such as the X-Z plane. Similarly, the first portion 410 can extend substantially in a horizontal plane (e.g., a unitless slope<0.15 while still possibly including one or more curves), such as the X-Y plane. One will note that the use of the phrases vertical plane and horizontal plane herein is not intended to limit the scope of the disclosure provided herein in, and is only intended to describe the orientation of the planes relative to each other versus the orientation of the planes to the world since the photovoltaic apparatus 1000 can be installed or positioned in any desired orientation when in use.

The photovoltaic apparatus 1000 includes a first busbar 170 extending adjacent to the first end 403 of the photovoltaic apparatus 1000 and a second busbar 180 (not shown in FIG. 1A, see FIG. 1B) extending adjacent to the second end 404 of the photovoltaic apparatus 1000. The busbars 170, 180 can be used to make electrical connections, for example electrical connections of opposite polarity, to the photovoltaic device 100 shown in FIG. 1B. The busbars 170, 180 are generally formed of a non-transparent conductive material, such as a conductive metal (e.g. a copper busbar) that is disposed over a portion of the photovoltaic device (i.e., the light-exposed side). Thus, the areas where the non-transparent busbars of a photovoltaic apparatus are positioned generally include areas that do not generate energy.

In some embodiments, the first busbar 170 can be disposed partially or entirely in the second portion 405. Similarly, the second busbar 180 can be disposed partially or entirely in the third portion 406. By positioning the busbars 170, 180 in the corresponding portions 405, 406, the busbars 170, 180 are located on a portion of the photovoltaic apparatus 1000 that receives, over the course of an average day, less light per unit area than portions oriented to generate energy. When two photovoltaic apparatuses 1000 are placed closely next to each other, for example in an adjacent configuration, such that a busbar in one of the photovoltaic apparatuses 1000 is facing a busbar in the other photovoltaic apparatus 1000 (e.g., within less than 5 centimeters, such as less than 1 cm), these two busbars can be located on portions of the respective photovoltaic apparatuses that may receive even less light on average because of mutual shading of these portions by the adjacent photovoltaic apparatuses 1000. By positioning the busbars 170, 180 in areas that receive less light on average, a larger proportion of a structure's supporting surface (e.g., exterior surface of a roof) can be covered by the active areas of the photovoltaic apparatuses 1000 that generate energy. An example of such an arrangement is illustrated in FIG. 2A. Furthermore, the portions 405, 406 can be oriented substantially perpendicular to the first portion 410 as well as substantially perpendicular to the supporting structure (e.g., a roof), which substantially reduces the surface area of the supporting structure that the portions 405, 406 cover. Therefore, more energy can be generated for a given large area of the surface of the supporting structure (i.e., an area large enough to support multiple photovoltaic apparatuses spaced apart from each other on the supporting structure) covered by the photovoltaic apparatuses 1000 than by a similar photovoltaic apparatus that does not include the portions 405, 406.

The photovoltaic apparatus 1000 can further include a plurality of fastening points 4030 for attaching one photovoltaic apparatus 1000 to another photovoltaic apparatus 1000 or for mounting the photovoltaic apparatus 1000 to another structure, such as a wall.

The photovoltaic apparatus 1000 can further include a junction box 330. The junction box 330 includes a first cable 370 having a first connector 372. Although not shown the first cable 370 can be electrically connected to the first busbar 170 by use of one or more junction busbars or other conductors. The junction box 330 further includes a second cable 380 having a second connector 382. Although not shown the second cable 380 can be electrically connected to the second busbar 180 by use of one or more junction busbars or other conductors. The junction box 330 can be used to electrically connect the photovoltaic apparatus 1000 to an external device, such as another photovoltaic apparatus 1000, a charge controller or other electronics for charging one or more power sources (e.g., a battery bank), or electrical systems that may be used to feed electrical power to an electrical grid.

FIG. 1B is a top schematic view of the photovoltaic apparatus 1000 prior to bending the photovoltaic apparatus 1000 to form the rigid folded portions 413, 414, according to one embodiment. The top schematic view of FIG. 1B illustrates the layout of different components in the photovoltaic apparatus 1000 although some of these components may not actually be visible in a top view. The photovoltaic apparatus 1000 includes a photovoltaic device 100 having a first end 101 spaced apart from a second end 102 in the Y-direction. Other embodiments of the photovoltaic apparatus 1000 may include multiple photovoltaic devices 100 spaced apart from each other in the X-direction and/or the Y-direction. These other embodiments of the photovoltaic apparatus 1000 can include, for example, photovoltaic devices 100 connected in series or in parallel as well as photovoltaic devices 100 that are not electrically connected to each other.

The photovoltaic device 100 includes an array of photovoltaic cells 105 extending from the first end 101 to the second end 102 in the Y-direction. Individual photovoltaic cells 105, extend from a first side 103 to a second side 104 of the photovoltaic device 100 in the X-direction. Serial interconnects 191 (e.g., monolithic serial interconnects) electrically divide the photovoltaic cells 105, so that consecutive photovoltaic cells 105 in the array are connected in series. In some embodiments, the serial interconnects 191 and the folding axis for one or more of the folded portions 413, 414 can extend in the same direction (e.g., the X-direction).

Furthermore, in some embodiments, the serial interconnect 191 between one or more pairs of photovoltaic cells 105 in the array can be located in one of the rigid folded portions 413, 414. The serial interconnects 191 of the photovoltaic device 100 can be areas with greater flexibility than other areas of the photovoltaic device 100, so forming the folded portions 413, 414 about a folding axis that extends in the same direction as the serial interconnects 191 or that coincide with the serial interconnects 191 can place less stress on the photovoltaic apparatus 1000 during folding. Furthermore, in some embodiments the serial interconnects 191 can be thicker in the Y-direction (i.e., the direction of the array) for serial interconnects located in the folded or curved portions 413, 414, to further enhance the flexibility of the photovoltaic apparatus 1000 at the folded portions 413, 414.

In some embodiments, a bypass diode (not shown) may be electrically connected in parallel to locations of opposite polarity of individual photovoltaic cells 105 that are in the folded portions 413, 414. For example, in one embodiment a bypass diode may be connected in the reverse bias direction to the busbar 170 and the serial interconnect 191 between the first photovoltaic cell 105 and the second photovoltaic cell 105 in the array. Using bypass diodes in these locations can help prevent the effects of having portions of one or more of the photovoltaic cells 105 that are shaded from the sun (e.g., reverse bias effect) and/or hot-spot heating. Thus, in some embodiments, it is desirable to form the photovoltaic apparatus 1000 such that none of the photovoltaic cells 105 are shaded, or even partially shaded, during normal use within an array of photovoltaic apparatuses. In other words, in some embodiments, all of the photovoltaic cells 105 (e.g., active portion of the photovoltaic device) are substantially disposed within the first portion 410. In other embodiments, only a small portion of the last photovoltaic cells 105 disposed at either end of the photovoltaic apparatus 1000 in the Y-direction is disposed in the rigid folded portions 413, 414. In other embodiments, only a small portion of the last photovoltaic cells 105 disposed at either end of the photovoltaic apparatus 1000 in the Y-direction is disposed in the portions 405, 406.

After the photovoltaic apparatus 1000 is folded (i.e., folds or curves 413, 414 are formed), the first end 101 of the photovoltaic device 100 can be located in the second portion 405 (FIG. 1A) and the second end 102 can be located in the third portion 406 (FIG. 1A). Placing the ends 101, 102 in the portions 405, 406 allows the portions of the photovoltaic device 100 that are covered by the busbars 170, 180 to be oriented substantially perpendicular to the supporting surface (e.g., a roof), so that these lower power-generating portions of the photovoltaic device 100 do not cover a significant proportion of the surface area exposed to the sun and the surface area of the supporting surface of the photovoltaic installation.

Figure 1C:
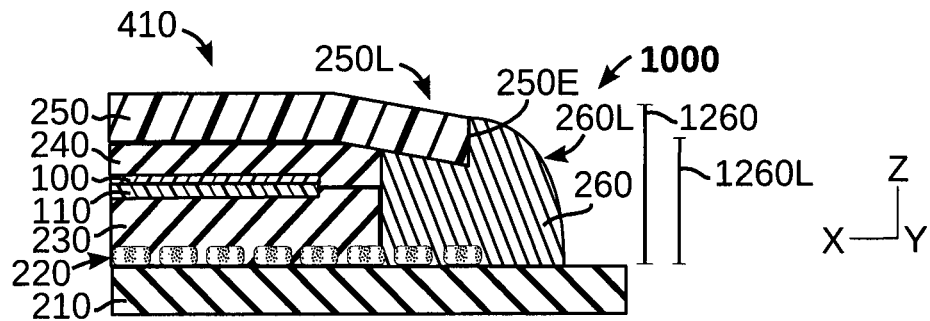
FIG. 1C is a side cross-sectional view of the photovoltaic apparatus of FIG. 1A viewed along the section line 1C of FIG. 1A, according to one embodiment.

FIG. 1C is a side cross-sectional view of the photovoltaic apparatus 1000 viewed along the section line 1C of FIG. 1A, according to one embodiment. The view in FIG. 1C shows the layers of the photovoltaic apparatus 1000 in the first portion 410, which is away from the rigid folded portions 413, 414 of the photovoltaic apparatus 1000. The photovoltaic apparatus 1000 includes the photovoltaic device 100 introduced above. The photovoltaic device 100 is formed on a substrate 110. In some embodiments, the substrate 110 may be a rigid substrate. In other embodiments, the substrate 110 can be a flexible substrate. Other embodiments may include a plurality of substrates, for example stacked on top of one another, in which some of the substrates are rigid and some of the substrates are flexible. The substrate 110 may also be formed from an electrically insulating material. For example, in one embodiment a polyimide substrate may be used, such as a polyimide substrate having a thickness in the Z-direction from about 5 µm to about 200 µm, such as from about 15 µm to about 100 µm.

In some embodiments, the photovoltaic device 100 can be thin-film layers deposited on the substrate 110, such as scribed thin-film layers including a plurality of monolithically interconnected photovoltaic cells, such as the photovoltaic cells 105 described above. In other embodiments, the photovoltaic device 100 can include a photovoltaic device formed on another substrate that is then positioned on the substrate 110.

The photovoltaic device 100 can be formed of, for example, a back-contact layer formed on the substrate 110, an absorber layer formed over the back-contact layer, and a front-contact layer formed over the absorber layer. The back-contact layer can be fabricated from a material having a high optical reflectance and is commonly made of molybdenum (Mo) although several other thin-film materials, such as metal chalcogenides, molybdenum chalcogenides, molybdenum selenides (such as $MoSe_2$), sodium (Na)-doped Mo, potassium (K)-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, titanium (Ti), tungsten (W), tantalum (Ta), gold (Au), silver (Ag), copper (Cu), and niobium (Nb) may also be used or included advantageously. In some embodiments, the back-contact layer is deposited onto the substrate 110 by use of sputtering process.

The absorber layer is typically made of an "ABC" material, wherein "A" represents elements in group 11 of the periodic table of chemical elements as defined by the International Union of Pure and Applied Chemistry including copper (Cu) or silver (Ag), "B" represents elements in group 13 of the periodic table including indium (In), gallium (Ga), or aluminum (Al), and "C" represents elements in group 16 of the periodic table including sulfur (S), selenium (Se) or tellurium (Te). An example of an ABC material is the Cu(In,Ga)Se2 semiconductor also known as CIGS. In some embodiments, the absorber layer may be a polycrystalline material. In other embodiments, the absorber layer may be a monocrystalline material. Another example of a material that may be used as the absorber layer is chalcopyrite.

The front-contact layer can be an electrically conductive and optically transparent material, such as a transparent conductive oxide (TCO) layer. For example, in some embodiments, the front-contact layer may be formed of doped or non-doped variations of materials, such as indium oxides, tin oxides, or zinc oxides.

In some embodiments, a semiconductive buffer layer can be disposed between the absorber layer and the front-contact layer. The semiconductive buffer layer ordinarily has an energy bandgap higher than 1.5 eV. The semiconductive buffer layer may be formed of materials, such as CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

The first busbar 170 (FIG. 1B) forms an electrical connection to the first end 101 of the photovoltaic device 100, such as to the back-contact layer through a connection region of the front-contact layer of the photovoltaic device 100 that is coupled to the back-contact layer at the first end 101 of the photovoltaic device 100. The first busbar 170 may be a conductive material that forms the cathode of the photovoltaic device 100. In some embodiments, the first busbar 170 may be formed of a flexible material.

The second busbar 180 (FIG. 1B) forms an electrical connection to the second end 102 of the photovoltaic device 100, such as to the to the front-contact layer of the photovoltaic device 100 at the second end 102 of the photovoltaic device 100. The second busbar 180 may be a conductive material that forms the anode of the photovoltaic device 100. In some embodiments, the second busbar 180 may be formed of a flexible material.

The photovoltaic device 100 may be encapsulated within the photovoltaic apparatus 1000 by use of a front-side adhesive 240 and a back-side adhesive 230. In some embodiments, the front-side adhesive 240 and the back-side adhesive 230 completely surround and encapsulate the photovoltaic device 100. The front-side adhesive 240 is formed over the front-contact layer of each of the photovoltaic device 100, and also over the first and second busbars 170, 180. The front-side adhesive 240 may be formed of a flexible material, such as a flexible polymer. For example, in one embodiment the front-side adhesive 240 may be formed of a thermoplastic olefin (TPO) based polymer or a TPO blend.

The back-side adhesive 230 is disposed over the side of the substrate 110 that is opposite to the side that the photovoltaic device 100 is formed on. The back-side adhesive 230 may be formed of a flexible material, such as a flexible polymer. For example, in one embodiment the back-side adhesive 230 may be formed of a thermoplastic olefin-based polymer (TPO) or a TPO polymer blend. The back-side adhesive 230 may contact the front-side adhesive 240 at each side of the photovoltaic device 100 (i.e., along the sides 401, 401 of the photovoltaic apparatus 1000 in FIG. 1A) and also at either end of the photovoltaic device 100 (i.e., along the ends 403, 404 of the photovoltaic apparatus 1000 of FIG. 1A), so that the front-side adhesive 240 and the back-side adhesive 230 completely surround and encapsulate the photovoltaic device 100.

Referring to FIGS. 1A and 1C, a front sheet 250 can be disposed on an outer surface of the front-side adhesive 240, such as a top surface of the front-side adhesive 240. The front sheet 250 can be formed of a transparent material, such as glass or a transparent thermoplastic polymer. In some embodiments, the front sheet 250 may be formed of a rigid material or a material that is rigid at ambient temperature. In other embodiments, the front sheet 250 may be formed of a flexible material. In other embodiments, the front sheet 250 may be formed of an assembly of flexible and rigid materials. The front sheet 250 can extend at least partially through each of the second portion 405, the first rigid folded portion 413, the first portion 410, the second rigid folded portion 414, and the third portion 406. In some embodiments, the front sheet 250 can extend in the X-direction across the entire first rigid folded portion 413, the entire first portion 410, and the entire second rigid folded portion 414.

A back sheet 210 can be disposed on an outer surface of the back-side adhesive 230, such as a bottom surface of the back-side adhesive 230. The back sheet 210 may include a reflective material, such as a metal layer, a reflective polymer or a polymer with a reflective layer (e.g., metal foil). In some embodiments, the back sheet 210 may be formed of a rigid material, such as a bendable rigid material. In other embodiments, the back sheet 210 may be formed of a flexible material, such as a bendable flexible material. Examples of materials that may be used to form the back sheet 210 include metal, stainless steel, aluminum, polymers, and fiber-reinforced polymers. The front sheet 250 can be spaced apart from the back sheet 210 by a first distance 1260. The first distance 1260 can be from about 0.1 mm to about 8 mm, such as from about 0.5 mm to about 3 mm, such as from about 1.2 mm to about 2.5 mm. Referring to FIG. 1A, the back sheet 210 can extend at least partially through each of the second portion 405, the first rigid folded portion 413, the first portion 410, the second rigid folded portion 414, and the third portion 406. In some embodiments, the front sheet 250 can extend in the X-direction across the entire second portion 405, the entire first rigid folded portion 413, the entire first portion 410, the entire second rigid folded portion 414, and the entire third portion 406. The photovoltaic device 100 is disposed between the front sheet 250 and the back sheet 210. In some embodiments, devices 100 disposed between the front sheet 250 and the back sheet 210 in each of the first portion 410, the second portion 405, the third portion 406, the first rigid folded portion 413, and the second rigid folded portion 414.

In some embodiments, the front sheet 250 can include an outer portion 250L that is bent towards the back sheet 210. The bending of the outer portion 250L can be caused by pressure placed on the front sheet 250 during a lamination process used to adhere the different layers of the photovoltaic apparatus 1000 to each other. The outer portion 250L of the front sheet 250 can be spaced apart from the back sheet 210 by a second distance 1260L. The second distance 1260L can be from about 0 mm (i.e., the outer portion 250L of the front sheet 250 contacts the back sheet 210) to about 8 mm, such as from about 0.2 mm to about 3 mm, such as from about 0.3 mm to about 2.5 mm. The photovoltaic apparatus 1000 can further include an edge seal 260. The presence of the edge seal 260 at the edge of the photovoltaic apparatus 1000 can eliminate common photovoltaic apparatus manufacturing and photovoltaic device failure modes, such as ingress of moisture to the interior of the photovoltaic apparatus 1000. In general, the edge seal 260 comprises a polymeric material, such as an elastomer, for example a butyl rubber that can be formed by dispensing a liquid precursor material along the edge of the photovoltaic apparatus 1000 and allowing it to cure. The edge seal 260 can be disposed between the back sheet 210 and the front sheet 250. In some embodiments, the edge seal 260 can further extend to an outer edge 250E of the front sheet 250. The edge seal 260 includes a first portion 260L disposed away from the folded portions 413, 414 (FIG. 1A). The edge seal 260 can extend beyond the outer edges (e.g., outer edge 250E) of the front sheet 250 for a distance from about 0 mm (i.e., no extension) to about 30 mm, such as from about 1 mm to about 10 mm, such as from about 3 mm to about 6 mm.

In some embodiments, the photovoltaic apparatus 1000 can further include a plurality of rovings 220 or other spacing material. The plurality of rovings 220 can be positioned on the back sheet 210 in some embodiments. Each roving 220 can be formed of a bundle of organic or inorganic fibers. The fibers in the rovings 220 may be formed of a fibrous material, such as fiberglass. In other embodiments, the rovings 220 may be formed of another fiber material, such as a carbon fiber material, or of a fabric. In other embodiments, the rovings 220 may be formed of a layer of a unidirectional glass fiber with a non-woven binder.

The rovings 220 can be embedded in the back-side adhesive 230 during a lamination process, which is used to form the photovoltaic apparatus 1000. Because the rovings 220 can be formed from a rigid material that can be arranged in a desirable structural pattern or orientation, such as fiberglass, the rovings 220 can be used to maintain a spacing between an electrically active component of the photovoltaic device 100, such as the back-contact layer described above, and an external object. Furthermore, a material such as fiberglass generally does not substantially shrink or compress over time, which enables spacing between electrically active components and external objects to be maintained over time in the photovoltaic apparatus 1000. Maintaining adequate spacing between electrically active components of the photovoltaic device 100, such as the back-contact layer described above, and an external object can help to prevent occurrences of arcing.

Figure 1D:
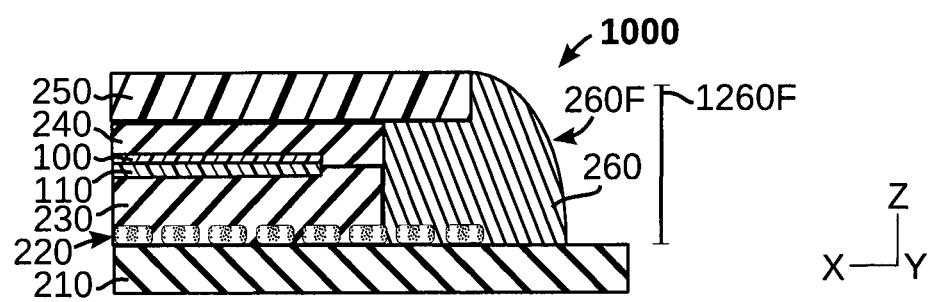
FIG. 1D is a side cross-sectional view of the photovoltaic apparatus of FIG. 1A viewed along the section line 1D of FIG. 1A, according to one embodiment.

FIG. 1D is a side cross-sectional view of the photovoltaic apparatus 1000 viewed along the section line 1D of FIG. 1A, according to one embodiment. The view in FIG. 1D shows the layers of the photovoltaic apparatus 1000 at the rigid folded portion 413 of the photovoltaic apparatus 1000. The view shown in FIG. 1D may also be substantially the same if taken at the rigid folded portion 414. The view shown in FIG. 1D is similar to the view shown in FIG. 1C except that the front sheet 250 does not include the outer portion 250L that is bent towards the back sheet 210. The front sheet 250 is not bent towards the back sheet 210 at the folded portions 413, 414 because the folding process used to form the folded portions 413, 414 can cause a front sheet that is bent towards the back sheet to straighten out, which can increase the risk of delamination or a compromised edge seal.

Along the section line 1D, the front sheet 250 is spaced apart from the back sheet 210 by a distance 1260F. The distance 1260F can be from about 0.1 mm to about 8 mm, such as from about 0.5 mm to about 3 mm, such as about 1.5 mm to about 2.5 mm. In some embodiments, the distance 1260F can be from about 1.5 times to about 4 times greater than the distance 1260L, such as about 2.0 times to about 2.5 times greater than the distance 1260L. Maintaining the distance 1260F less than about 4 times the distance 1260L can help prevent delamination of the photovoltaic apparatus 1000 near the outer edges, such as where the edge seal 260 is located.

Figure 1E:
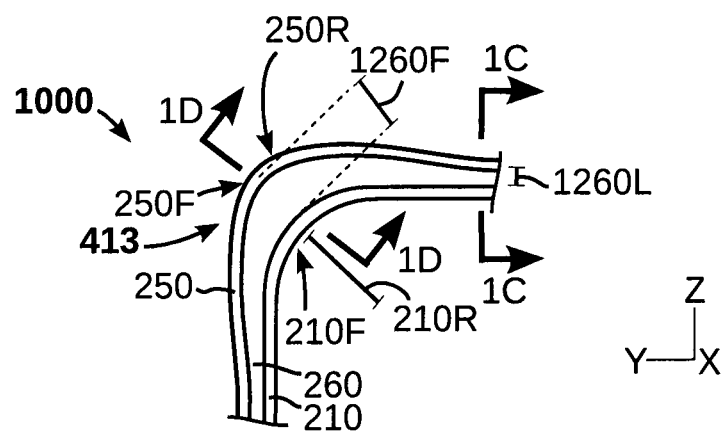
FIG. 1E is a side cross-sectional view of the photovoltaic apparatus of FIG. 1A at a folded portion of the photovoltaic apparatus viewed along the section line 1E of FIG. 1A view, according to one embodiment.

FIG. 1E is a side cross-sectional view of the photovoltaic apparatus 1000 at the rigid folded portion 413 viewed along the section line 1E of FIG. 1A view, according to one embodiment. Section line 1E extends through outer portions of the photovoltaic apparatus 1000 (e.g., close to the edge of the photovoltaic apparatus 1000 at the side 402), so that the only layers visible are the front sheet 250, the edge seal 260, and the back sheet 210. The back sheet 210 includes a folded portion 210F having a radius of curvature 210R from about 3 mm to about 50 cm, such as from about 5 mm to about 30 mm, such as from about 8 mm to about 20 mm. The front sheet 250 includes a folded portion 250F having a radius of curvature 250R from about 1 mm to about 400 mm, such as from about 3 mm to about 10 mm. In some embodiments, the folded portion 210F and the folded portion 250F can be created in one folding process as discussed below in reference to FIG. 5. Furthermore, in some embodiments, the folded portion 250F tends not to be parallel to the folded portion 210F because the edge portions of the front sheet 250 can retract as a result of the folding process.

In some embodiments, the photovoltaic apparatus 1000 includes a rigid structure. The photovoltaic apparatus 1000 can obtain its rigid structure from one or more of the components in the photovoltaic apparatus 1000, such as a rigid back sheet 210 and/or a rigid front sheet 250 and/or a rigid substrate 110. In general, a rigid structure used in a photovoltaic apparatus 1000 allows the photovoltaic apparatus 1000 to retain its shape regardless of how the photovoltaic apparatus 1000 is positioned or supported. For example, referring to the cutaway 500A in FIG. 1A, a distance from a lower edge 405E of the second portion 405 to a lower edge 406E of the third portion 406 will not substantially change, due to the distribution of the weight of its internal components, regardless of how the photovoltaic apparatus is positioned or supported. For example, for a first class of embodiments, the bending stiffness of at least one of the first portion 410, the second portion 405, the third portion 406, or the entire photovoltaic apparatus 1000 may be greater than 60 N/m, such as greater than 130 N/m, such as greater than 250 N/m, or for a second class of embodiments, greater than 15 kN/m, such as greater than 30 kN/m.

The rigid structure of the photovoltaic apparatus 1000 can prevent the photovoltaic apparatus 1000 from substantially distorting under normal operating conditions (i.e. no extreme loads placed on the photovoltaic apparatus 1000, such as extreme winds). For example, for embodiments having a substantially horizontal first portion 410, the back sheet 210 in the first portion 410 does not substantially distort in a vertical direction (i.e., the center 410C of the first portion 410 does not sag by more than 5% of the width in the Y-direction of the first portion 410 in the Z-direction relative to any other portion of the first portion 410) when the back sheet 210 in the second portion 405 and the back sheet 210 in the third portion 406 are placed on a flat horizontal surface and no external vertical support is provided to any portion of the back sheet 210 in the first portion 410.

Additionally, the folded portions 413, 414 are also rigid and required no extra support external to the photovoltaic apparatus 1000 to maintain their shape. For example, in some embodiments the first rigid folded portion 413 can consist of a portion of the back sheet 210, a portion of the front sheet 250, and one or more components (or one or more module components) disposed between the portion of the back sheet 210 and the portion of the front sheet 250, such as the photovoltaic device 100, the substrate 110 and adhesives 230, 240. Similarly, the second rigid folded portion 414 can consist of a portion of the back sheet 210, a portion of the front sheet 250, and one or more components disposed between the portion of the back sheet 210 and the portion of the front sheet 250, such as the photovoltaic device 100, the substrate 110 and adhesives 230, 240. Thus, the folded portions 413, 414 would also retain their shape as the photovoltaic apparatus 1000 is rotated 360° about an X-axis passing through a center-line of the first portion 410 (i.e., the angle between the second portion 405 or the third portion 406 and the first portion 410 would not change by more than 10°, such as not by more than 5°, such as not more than 2°, throughout the entire rotation).

Furthermore, the rigid structure of the photovoltaic apparatus 1000 can reduce the installation costs of the photovoltaic apparatus 1000 relative to photovoltaic apparatus is not having a rigid structure. For example, the photovoltaic apparatus 1000 can be placed on a supporting structure with the portions 405, 406 contacting the supporting structure (e.g., a roof) and the first portion 410 spaced apart from the supporting structure, such as being elevated above a flat horizontal roof. Thus, the photovoltaic apparatus 1000 is a self-supporting structure and in some embodiments installation only entails securing the photovoltaic apparatus 1000 to the supporting structure (e.g., a roof) and make electrical connections. Moreover, the rigid structure causes the portions 405, 406 contacting the supporting structure to be oriented substantially perpendicular to the supporting structure, which enables the busbars 170, 180 to be positioned to receive less light on average than the first portion 410 without requiring any specialized adjustments by the installer to position the portions of the apparatus containing the busbars. Also, for embodiments having a first portion 410 with a width in the Y-direction that is less than 200 cm, such as less than 50 cm, the photovoltaic apparatus 1000 may not require any external frame or other components from additional materials to stiffen and/or hold the structure together, which can reduce the manufacturing costs of the photovoltaic apparatus 1000 relative to photovoltaic apparatuses that require additional components for support.

FIG. 2A is a top perspective view of a photovoltaic apparatus 2000, according to one embodiment. The photovoltaic apparatus 2000 includes a first photovoltaic module 1000a and a second photovoltaic module 1000b. The first photovoltaic module 1000a includes an array of three photovoltaic sub-modules 1101a, 1102a, and 1103a. The second photovoltaic module 1000b includes an array of three photovoltaic sub-modules 1101b, 1102b, and 1103b. Each photovoltaic module 1000a, 1000b can be the same as the photovoltaic apparatus 1000 described above. The individual sub-modules were not shown in FIGS. 1A and 1B for clarity reasons. The photovoltaic apparatus 2000 is an example of an embodiment in which the light exposed surfaces (e.g., the first surfaces 411) of the different photovoltaic modules 1000a, 1000b are positioned across a same plane (i.e., the horizontal plane here), but other embodiments may include photovoltaic modules having light exposed surfaces on different planes, such as the embodiments described below in reference to FIGS. 2B and 2C.

In the photovoltaic apparatus 2000, the second rigid folded portion 414 of the first photovoltaic module 1000a can face and in some other embodiments can contact the first rigid folded portion 413 of the second photovoltaic module 1000b. In some embodiments, the front sheet 250 in the second rigid folded portion 414 of the first photovoltaic module 1000a can contact the front sheet 250 in the first rigid folded portion 413 of the second photovoltaic module 1000b. Similarly, in some embodiments, the back sheet 210 in the second rigid folded portion 414 of the first photovoltaic module 1000a can contact the back sheet 210 in the first rigid folded portion 413 of the second photovoltaic module 1000b.

Referring to FIGS. 1A and 2A, the photovoltaic sub-modules within each photovoltaic module 1000a, 1000b may be electrically connected in parallel between the busbars 170, 180. Furthermore, the first photovoltaic module 1000a may be electrically connected in series to the second photovoltaic module 1000b by connecting the second cable 380 of the first photovoltaic module 1000a to the first cable 370 of the second photovoltaic module 1000b. Additionally, the photovoltaic modules 1000a, 1000b may be fastened to each other by aligning the fastening points 4030 of the respective photovoltaic modules 1000a, 1000b and using corresponding fasteners (not shown).

The fastening points 4030 may include one or more cuts or holes through the back sheet 210. In some embodiments, the fastening points 4030 can include a flap that can be inserted into the fastening point 4030 of another photovoltaic apparatus. In some embodiments, the fastening points 4030 may include a first side 4031 and a second side 4032 spaced apart from each other in the X-direction, where the second side 4032 is wider than the first side 4031 in the Z-direction giving the portion of back sheet 210 removed or the remaining flap a trapezoidal shape. In some embodiments, a flap from a first photovoltaic module can be inserted at the fastening point 4030 of another photovoltaic module, where the flap is inserted at the wider second side 4032 of the fastening point 4030 of the other photovoltaic module and forced towards the narrower first side 4031 to assist with interlocking the two photovoltaic modules together. The flap from each photovoltaic module can be inserted into the fastening point 4030 of the other photovoltaic module using this technique.

The benefit of using photovoltaic modules 1000a, 1000b having folded portions 413, 414 is clearly shown in FIG. 2A because the second busbar 180 of the first photovoltaic module 1000a and the first busbar 170 of the second photovoltaic module 1000b are both not visible and substantially hidden from incident light upon the photovoltaic apparatus 2000. For example, along line 2A of FIG. 2A, there is little to no area that is not capable of producing photovoltaic energy because the busbars are no longer blocking any of the portions of the photovoltaic devices 100 in the photovoltaic sub-modules 1102a, 1102b that are exposed to light along the line 2A. Thus, the amount of space on a supporting surface (e.g., a roof) that cannot be used to produce photovoltaic energy in the Y-direction of FIG. 2A can be substantially reduced or even eliminated. Although not shown, in some embodiments, the photovoltaic modules may also be folded over at the opposing sides 401, 402 (FIG. 1A), so that the amount of space on a supporting surface (e.g., a roof) that cannot be used to produce photovoltaic energy in the X-direction of FIG. 2A can also be reduced or eliminated.

FIG. 2B is a side schematic view of a photovoltaic apparatus 2010, according to one embodiment. The photovoltaic apparatus 2010 includes a first photovoltaic module 1000c and a second photovoltaic module 1000d. The photovoltaic modules 1000c, 1000d may each include a plurality of photovoltaic sub-modules (not shown) similar to the photovoltaic modules shown in FIG. 2A. Each photovoltaic module 1000c, 1000d includes an outer folded portion 415 and an inner folded portion 416 connected to each other through an intermediate portion 420. The intermediate portion 420 forms the majority of the light-exposed surface of the photovoltaic modules 1000c, 1000d. The outer folded portion 415 may extend for a height 414h in the vertical z-direction that is greater than a height 413h of the inner folded portion 416. The photovoltaic modules 1000c, 1000d having a greater height 414h at the outer folded portion 415 than the height 413h at the inner folded portion 416 can be useful to use when attempting to take advantage of East-West movement of the sun relative to the photovoltaic modules.

In some embodiments, an intermediate pad 1002 (also referred to as a duct) can be disposed between the first photovoltaic module 1000c and the second photovoltaic module 1000d. The photovoltaic modules 1000c, 1000d may be fastened to the intermediate pad 1002 or fastened to each other through the intermediate pad 1002. In other embodiments, the photovoltaic modules 1000c, 1000d may be fastened directly to each other without the use of the intermediate pad 1002. The photovoltaic modules 1000c, 1000d may include fastening points similar to the fastening points 4030 described above. The intermediate pad 1002 may be designed to include a variety of functions, such as a cushion against thermal expansion of the photovoltaic modules 1000c, 1000d or friction between the photovoltaic modules 1000c, 1000d. Additionally, the intermediate pad 1002 can function as a gutter or duct to flush out water and debris from the photovoltaic modules 1000c, 1000d or as a vent to evacuate heat trapped under the photovoltaic modules 1000c, 1000d. Furthermore, in some embodiments the intermediate pad 1002 may further include structural members, such as wires or spikes, to prevent birds from landing on the photovoltaic modules 1000c, 1000d. In some embodiments, the intermediate pad 1002 may be formed of folded sheet metal, a polymer, such as an elastomer, such as butyl or silicone. The photovoltaic modules 1000c, 1000d can be structures having a similar bending stiffness as the photovoltaic apparatus 1000 described above. For example, the photovoltaic modules 1000c, 1000d will not substantially distort when the position or orientation of the photovoltaic modules are changed. For example, for a first class of embodiments, the bending stiffness of at least one of the intermediate portion 420, the outer folded portion 415, the inner folded portion 416, or the entire photovoltaic apparatus 1000c, 1000d may be greater than 60 N/m, such as greater than 130 N/m, such as greater than 250 N/m, or for a second class of embodiments, greater than 15 kN/m, such as greater than 30 kN/m.

FIG. 2C is a side schematic view of a photovoltaic apparatus 2020, according to one embodiment. The photovoltaic apparatus 2020 includes a first outer photovoltaic module 1000e, a second outer photovoltaic module 1000f, and an inner photovoltaic module 1000g disposed between the outer photovoltaic modules 1000e, 1000f, where the first outer photovoltaic module 1000e is spaced apart from the second outer photovoltaic module 1000f in the Y-direction. The photovoltaic modules 1000e, 1000f, 1000g may each include a plurality of photovoltaic sub-modules (not shown) similar to the photovoltaic modules shown in FIG. 2A. Each outer photovoltaic module 1000e, 1000f includes an outer folded portion 417 and an inner folded portion 418. The outer folded portion 417 may extend for a height in the vertical z-direction that is greater than the height of the inner folded portion 418. A lower portion of each outer folded portion 417 can extend in a substantially vertical plane. The outer photovoltaic modules 1000e, 1000f each have a corresponding center 1000ec, 1000fc in the Y-direction. The lower portion of each inner folded portion 418 may curve towards the outer folded portion 417 of that photovoltaic module. In some embodiments, the lower portion of each inner folded portion 418 may extend in an angled plane.

The inner photovoltaic module 1000g may include a first rigid folded portion 413g and a second rigid folded portion 414g. The inner photovoltaic module 1000g has a center 1000gc in the Y-direction, and the light-exposed surface of the photovoltaic module 1000g may be convex. Each rigid folded portion 413g, 414g of the inner photovoltaic module 1000g includes a double bend having an outwardly extending bend 421 extending away from the center 1000gc in the Y-direction, and an inwardly extending bend 422 extending back towards the center 1000gc in the Y-direction. The outwardly extending bend 421 of the first rigid folded portion 413g extends over the photovoltaic module 1000e, and the outwardly extending bend 421 of the second rigid folded portion 414g extends over the photovoltaic module 1000f.

In some embodiments, the inner photovoltaic module 1000g can be securely installed (e.g., snapped into place) between the outer photovoltaic modules 1000e, 1000f by placing a force on the inner photovoltaic module 1000g, so that the inwardly extending bends 422 (concave portions) of the folded portions 413g, 414g compress against the inner folded portions 418 (convex portions) of each outer photovoltaic module 1000e, 1000f while the outwardly extending bends 421 of the folded portions 413g, 414g remain above the inner folded portions 418 of the outer photovoltaic modules 1000e, 1000f in the Z-direction. In some embodiments, a seal 1003 may be disposed between the inner folded portions 418 of the outer photovoltaic modules 1000e, 1000f and the folded portions 413g, 414g of the inner photovoltaic module 1000g. The seal 1003 can be formed of a variety of materials, such as a polymer, an elastomer, butyl, silicone, or folded sheet metal. The seal 1003 can function as a seal against water and dirt accumulation as well as protect the photovoltaic apparatus 2020 from mechanical damage caused by thermal expansion or friction between the photovoltaic modules 1000e, 1000f, 1000g.

The photovoltaic modules 1000e, 1000f, 1000g may be electrically connected to each other in series by use of cables or other conductors extending from corresponding junction boxes 330e, 330f, 330g attached to each of the photovoltaic modules 1000e, 1000f, 1000g. The junction boxes 330e, 330f, 330g may be located at or near the highest locations of the back sheets of the corresponding photovoltaic modules 1000e, 1000f, 1000g (i.e., at the center 1000gc of the photovoltaic module 1000g and at the inner folded portions 418 of the photovoltaic modules 1000e, 1000f) to assist in reducing the probability of water ingress to the junction boxes 330e, 330f, 330g.

The photovoltaic modules 1000e, 1000f, 1000g can be structures having a similar rigidness as the photovoltaic apparatus 1000 described above. For example, the photovoltaic modules 1000e, 1000f, 1000g will not substantially distort when the position or orientation of the photovoltaic modules are changed. For example, for a first class of embodiments, the bending stiffness of at least one of the portions 417, 413g, 418, 414g, or the entire photovoltaic modules 1000e, 1000f, 1000g may be greater than 60 N/m, such as greater than 130 N/m, such as greater than 250 N/m, or for a second class of embodiments, greater than 15 kN/m, such as greater than 30 kN/m.

FIG. 3A is a side cross-sectional view of a photovoltaic apparatus 1010, according to one embodiment. The photovoltaic apparatus 1010 is similar to the photovoltaic apparatus 1000 (e.g., as shown in FIG. 1D) except that the photovoltaic apparatus 1010 includes an edge seal 360 that is different than the edge seal 160 included in the photovoltaic apparatus 1000. The edge seal 360 can be reshaped after a folding process is performed on the photovoltaic apparatus 1010 to form folded portions, such as the folded portions 413, 414 described above.

FIG. 3B is a side cross-sectional view of an edge seal reshaping tool 3600, according to one embodiment. The edge seal reshaping tool 3600 can be used to reshape the edge seal 360 after a folding process is performed on the photovoltaic apparatus 1010. The edge seal reshaping tool 3600 can be designed according to the dimensions of the photovoltaic apparatus 1010 (e.g., distance between the top of the back sheet 210 and the top of the front sheet 250) to give the formed edge seal 360 one or more features, such as an overlap 362, a hump 363, and a ramp 364. The overlap 362 extends over a top surface 251 of the front sheet 250 (i.e., the surface of the front sheet facing away from the photovoltaic device 100) to create a stronger seal against the environment to protect the internal components of the photovoltaic apparatus 1010, such as the photovoltaic device 100.

The hump 363 can extend above the overlap 362 in the Z-direction to provide extra padding for the photovoltaic apparatus 1010, which may protect the photovoltaic apparatus from mechanical damage, such as friction caused by an expanding or contracting adjacent photovoltaic apparatus 1010 that are positioned to contact or are in close proximity to the hump 363. In some embodiments, the edge seal 360 can be formed of butyl or similar material that can be fused with the edge seal 360 of an adjacent photovoltaic apparatus 1010. The ramp 364 extends from the hump 363 to the back sheet 210. The ramp 364 can have a variety of shapes, such as a flat, concave, or convex shape. Furthermore in some embodiments, the ramp 364 or other portions of the edge seal 360 may include a pattern, such as an embossed label.

Although the overlap 362, the hump 363, and the ramp 364 are described as being formed at a folded portion of the photovoltaic apparatus 1010, such as the folded portions 413, 414 described above, in some embodiments the overlap 362, the hump 363, and the ramp 364 can extend around more of the perimeter of the photovoltaic apparatus 1010 or the entire perimeter of the photovoltaic apparatus 1010.

The edge seal reshaping tool 3600 can include a number of features that can be used to form the features of the edge seal 360, such as the overlap 362, the hump 363, and the ramp 364. For example, the edge seal reshaping tool 3600 can include a concave portion 3630 to form the hump 363. The edge seal reshaping tool 3600 can further include a first portion 3620 extending away from the concave portion 3630 to a lip 3610, where the first portion 3620 is designed to extend above the outer edge of the front sheet 250 and to contact the front sheet 250 with the lip 3610 at a distance close to the outer edge of the front sheet 250, such as a location where the edge seal 360 meets the adhesive layers 230, 240. The surface of the first portion 3620 the contacts the edge seal material can be flat, convex, or concave, and in some embodiments can include an embossing pattern. The lip 3610 may be rounded to avoid scraping the surface of the front sheet 250 when the edge seal reshaping tool 3600 is used to form the edge seal 360.

The edge seal reshaping tool 3600 can further include a second portion 3640 extending away from the concave portion 3630 to a base 3660, where the second portion 3640 can be used to form the ramp 364 of the edge seal 360. The base 3660 can include an edge 3650 that may be used to contact the back sheet 210 and scrape edge seal material (e.g., deburring excess edge seal material) towards the photovoltaic device 100 when the edge seal reshaping tool 3600 is used to form the edge seal 360. When the edge seal reshaping tool 3600 is placed in its final position to form the edge seal 360 with the edge 3650 placed on the back sheet 210 and the lip 3610 contacting the front sheet 250, a first angle 3670 may be formed between the base 3660 and the back sheet 210. The first angle 3670 can have a value from about 0° (i.e. the base 3660 is flat against the back sheet 210) to about 60°, such as from about 5° to about 30°.

In some embodiments, a heating element 3680 may be used to heat the edge seal material to facilitate the reshaping of the edge seal 360, such as by increasing the fluidity of the edge seal material. The heating element 3680 may be placed on an outer side of the edge seal reshaping tool 3600 relative to the edge seal 360, so that heat transfers through the edge seal reshaping tool 3600 to reach the edge seal material. In some embodiments the edge seal reshaping tool 3600 further includes a recess 3690 that may be used to receive another tool (e.g., an end effector coupled to a robotic arm) that can be used to move the edge seal reshaping tool 3600 along the back sheet 210 towards the photovoltaic device 100 to form the edge seal 360.

Figure 4A:
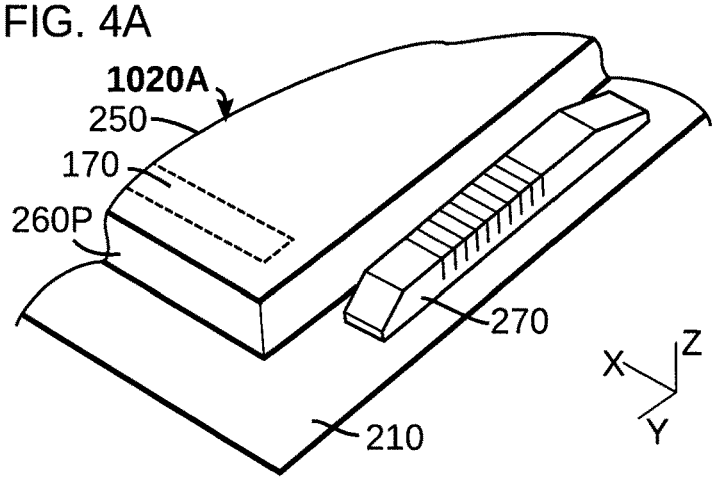
FIG. 4A is a top perspective view of a partially formed photovoltaic apparatus prior to being laminated, according to one embodiment.

FIG. 4A is a top perspective view of a partially formed photovoltaic apparatus 1020 prior to being laminated, according to one embodiment. The partially formed photovoltaic apparatus 1020A can include many or all of the components shown in the photovoltaic apparatus 1000 (see e.g., FIG. 1D), such as the back sheet 210, the back-side adhesive 230 (not shown), the substrate 110 (not shown), the photovoltaic device 100 (not shown), the front-side adhesive 240 (not shown), the front sheet 250, and edge seal material 260P. The edge seal material 260P has been placed between the back sheet 210 and the front sheet 250 and on the adhesive layers 230, 240, so that the adhesive layers 230, 240 are not visible. In some embodiments the edge seal material 260P may also overlap a portion of the top surface of the front sheet 250. A supporting spacer 270 may be placed on the back sheet 210 along an outer edge of the edge seal material 260P at a location, which will be used to form one of the folded portions of the photovoltaic apparatus, such as the folded portions 413, 414 described above (see e.g., FIG. 1A).

Figure 4B:
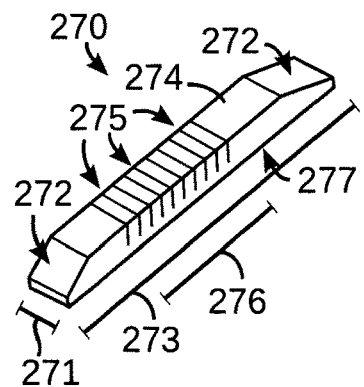
FIG. 4B is a top perspective view of a supporting spacer 270 shown in FIG. 4A, according to one embodiment.

FIG. 4B is a top perspective view of the supporting spacer 270 shown in FIG. 4A, according to one embodiment. The supporting spacer 270 can be used to limit the Z-direction movement of the front sheet 250 and laminating sheet 2015 (FIG. 4C) towards the back sheet 210 at the edge of the photovoltaic apparatus during lamination. By limiting the Z-direction movement of the front sheet 250, the risk of delaminating the front sheet 250 from the edge seal 260 during the subsequent folding process (i.e., such as the folding process used to form the folded portions 413, 414 described above in reference to FIG. 1A) can be reduced. In some embodiments, the supporting spacer 270 may be formed of a metal or a polymer, such as a rigid or flexible polymer.

The supporting spacer 270 can have a width 271 in the X-direction from about 2 mm to about 20 mm, such as from about 5 mm to about 10 mm. The supporting spacer 270 can have a length 273 in the Y-direction that is greater than the corresponding length of the portion of the front sheet 250 that is being folded, such as portions 413-c, 414c described above, by about 1 cm to about 5 cm, such as by about 2 cm. The supporting spacer 270 can include a central portion 274. The supporting spacer 270 can further include a ramp 272 sloping downward from the central portion 274 toward each end of the supporting spacer 270 in the Y-direction. The ramps 272 can help enable a smooth transition during lamination between sections of the photovoltaic apparatus that are supported by the supporting spacer 270 and sections that are not supported by the supporting spacer 270. The ramps 272 can also help to prevent localized areas of high stress on the front sheet 250 that could otherwise cause deformations to the front sheet 250.

In some embodiments, the supporting spacer 270 may further include a plurality of striations 275. The striations 275 can be useful to increase the flexibility of the supporting spacer 270, which may be useful when the folded portions of the photovoltaic apparatus are formed when the supporting spacer 270 is still on the back sheet 210. In some embodiments, the striations 275 extend across a length 276 of the supporting spacer 270 in the Y-direction that corresponds to the length in the Y-direction of the portions of the photovoltaic apparatus included in the folded portions, such as the folded portions 413, 414 or only of the curved portions 413-c, 414-c. Furthermore, in some embodiments, an adhesive 277 may be placed on the surface of the supporting spacer 270 that contacts the back sheet 210 to ensure that the supporting spacer 270 does not move during the lamination process.

Figure 4C:
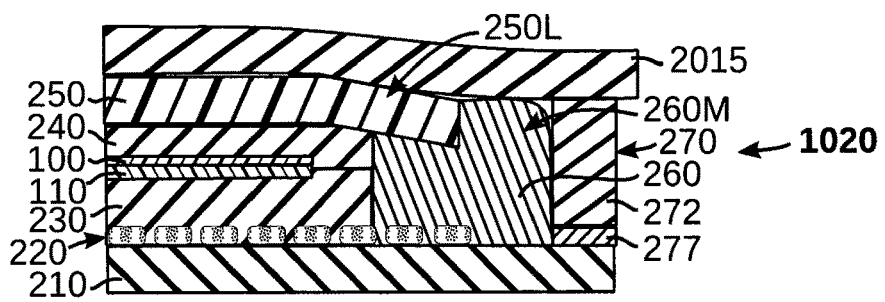
FIG. 4C is a cross-sectional view of a partially formed photovoltaic apparatus during a lamination process through a location of a ramp of the supporting spacer of FIG. 4B, according to one embodiment.

FIG. 4C is a cross-sectional view of the partially formed photovoltaic apparatus 1020 during a lamination process through a location of one of the ramps 272 of the supporting spacer 270, according to one embodiment. A laminating sheet 2015 can be placed over the front sheet 250, the edge seal 260 and the supporting spacer 270 to apply pressure to the components of the photovoltaic apparatus 1020 during the lamination. The laminating sheet 2015 can be a release sheet or a rubber sheet. Because the ramps 272 are lower in the Z-direction than the central portion 274 of the supporting spacer 270, the outer portion 250L of the front sheet 250 can bend towards the back sheet 210 at the location of the ramps 272. Furthermore, a portion 260M of the edge seal 260 can be compressed, so that the top of the portion 260M is aligned with the top of the ramp 272 in the Z-direction.

Figure 4D:
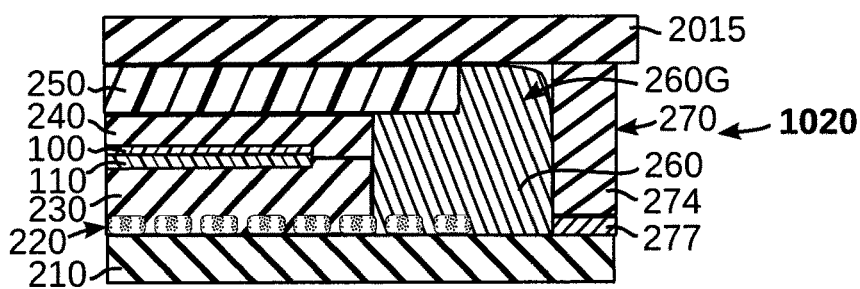
FIG. 4D is a cross-sectional view of a partially formed photovoltaic apparatus during a lamination process through a central portion of the supporting spacer of FIG. 4B, according to one embodiment.

FIG. 4D is a cross-sectional view of the partially formed photovoltaic apparatus 1020 during a lamination process through the central portion 274 of the supporting spacer 270, according to one embodiment. At the locations supported by the central portion 274 of the supporting spacer 270, the front sheet 250 is not bent down towards the back sheet 210. Furthermore the edge seal 260 at these locations can be formed of a portion 260G that is aligned with the top of the front sheet 250 and the top of the central portion 274 in the Z-direction.

Figure 4E:
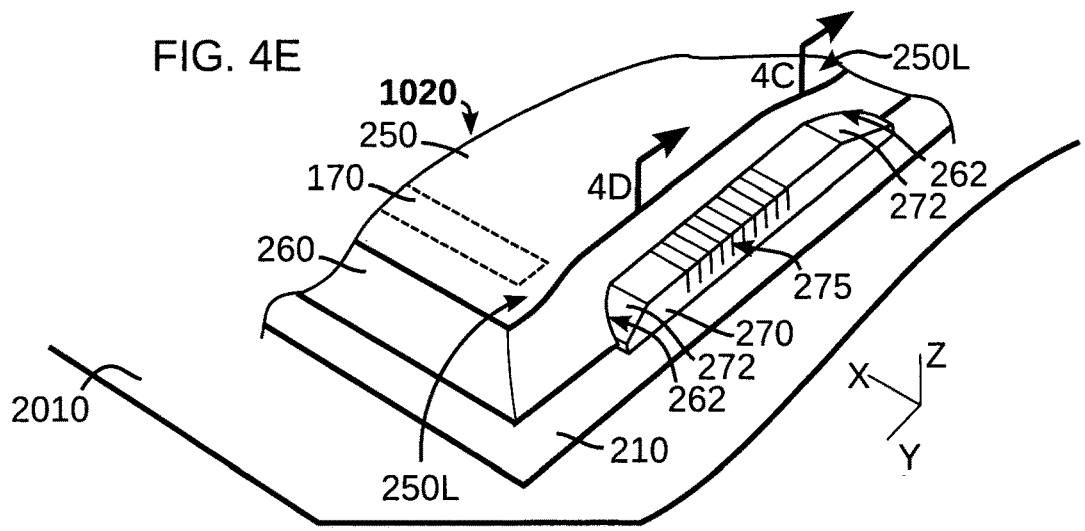
FIG. 4E is a top perspective view of a partially formed photovoltaic apparatus after a lamination process has been performed, according to one embodiment.

FIG. 4E is a top perspective view of the partially formed photovoltaic apparatus 1020 after the lamination process has been performed, according to one embodiment. The view in FIG. 4E further illustrates how the front sheet 250 bends down towards the back sheet 210 at the outer portions 250L. Furthermore, the view in FIG. 4E illustrates how portions 262 of the edge seal 260 have expanded outward to overlap portions of the ramps 272. In some embodiments, the supporting spacer 270 can remain in the photovoltaic apparatus 1020 and the portions 262 can help retain the supporting spacer 270 in its position throughout the useful life of the photovoltaic apparatus 1020. Lines 4C and 4D provide exemplary locations for where the cross-sectional views of the corresponding FIGS. 4C and 4D are taken.

Figure 4F:
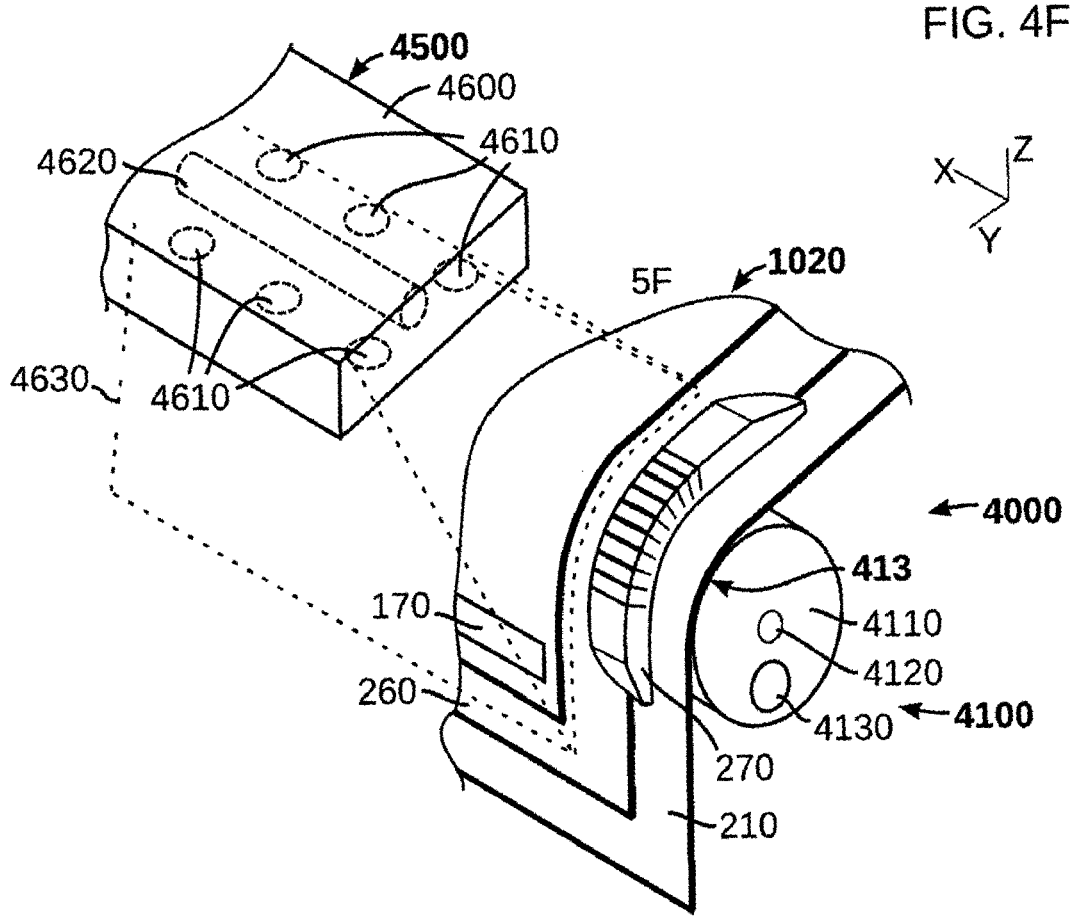
FIG. 4F is a top perspective view illustrating a folding process being performed on a photovoltaic apparatus to form a folded portion, according to one embodiment.

FIG. 4F is a top perspective view illustrating a folding process being performed on the photovoltaic apparatus 1020 to form the rigid folded portion 413 described above, according to one embodiment. The back sheet 210 of the photovoltaic apparatus 1020 may be placed on a back sheet roller assembly 4100 of a roller assembly 4000. The supporting spacer 270 may still be adhered to the back sheet 210 during the folding process. The roller assembly 4000 may include a plurality of rollers that may be used to apply pressure to the back sheet 210 and the front sheet 250 during the folding process. The back sheet roller assembly 4100 may be part of a plate bending machine. The back sheet roller assembly 4100 can include a back sheet roller 4110 and a central axle 4120 about which the roller 4110 can rotate. The back sheet roller 4110 can have a diameter from about 3 mm to about 500 mm, such as from about 10 mm to about 50 mm, such as from about 15 mm to about 25 mm. In some embodiments, the back sheet roller assembly 4100 can further include a heating element 4130 disposed inside the back sheet roller 4110. The heating element 4130 can be used to heat components of the photovoltaic apparatus 1020, such as the back sheet 210, the edge seal 260, and the back-side adhesive 230 to elevated temperatures, such as temperatures between 40° C. and 150° C.

In some embodiments a heating apparatus 4500 may be placed over the photovoltaic apparatus 1020 to heat components of the photovoltaic apparatus 1020, such as the front sheet 250 and the front-side adhesive 240. The heating apparatus 4500 may include a heating element 4620, such as a resistive heating element. In some embodiments heat radiating from the heating element 4620 may be sufficient to heat the photovoltaic apparatus 1020. In other embodiments, the heating apparatus 4500 includes a plurality of air ducts 4610 that can be used to blow hot air onto the photovoltaic apparatus 1020. The heating apparatus 4500 may include a fan or blower (not shown) to create a flow of hot air 4630 towards the photovoltaic apparatus 1020. The heating apparatus 4500 may heat the photovoltaic apparatus 1020 before and/or during the folding process. For example, heat can be applied to increase the temperature of the front sheet by about 0.5° C./s to about 20° C./s, such as by about 2° C./s to about 10° C./s.

Figure 4G:
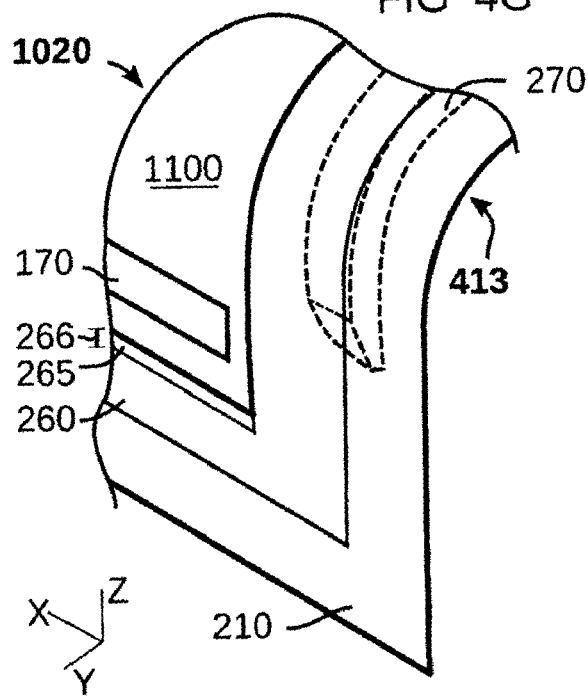
FIG. 4G is a top perspective view of a photovoltaic apparatus after the folding process described in reference to FIG. 4F has been performed, according to one embodiment.

FIG. 4G is a top perspective view of the photovoltaic apparatus 1020 after the folding process described in reference to FIG. 4F has been performed, according to one embodiment. The view in FIG. 4G shows the effect that the folding process has on the front sheet 250. For example, the front sheet 250 can retreat in the Z-direction relative to the position of the front sheet 250 over the back sheet 210 before the folding process. The front sheet 250 can be less elastic than other components of the photovoltaic apparatus 1020, such as the edge seal 260. An imprint 265 can be left on the edge seal 260 to show the position of the front sheet 250 on the edge seal 260 prior to the folding process. The difference between the position of the front sheet 250 before the folding process and after the folding process can be a distance from about 0.5 mm to about 8 mm, such as from about 1 mm to about 5 mm, such as from about 2 mm to about 4 mm. The supporting spacer 270 is shown with dashed lines to indicate that the supporting spacer 270 may be removed before the folding process, after the folding process, or optionally left on the photovoltaic apparatus 1020.

Figure 4H:
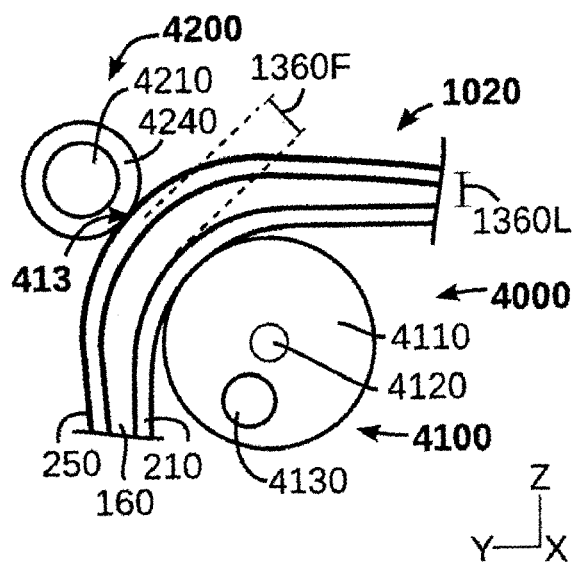
FIG. 4H is a side sectional view of an alternative folding process being performed on a photovoltaic apparatus, according to one embodiment.

FIG. 4H is a side sectional view of an alternative folding process being performed on the photovoltaic apparatus 1020, according to one embodiment. In this embodiment, a front sheet roller assembly 4200 is used in addition to the back sheet roller assembly 4100 described above. The photovoltaic apparatus 1020 can be moved between the roller assemblies 4100, 4200 during the folding process. The front sheet roller assembly 4200 can include a front sheet roller hub 4210, which may be heated in some embodiments, and a front sheet roller pad 4240. The front sheet roller pad 4240 can be formed of a soft material (e.g., a soft polymer) that can be used at high temperatures, such as temperatures from about 150° C. to about 200° C. FIG. 4H also illustrates another view of how the distance between the front sheet 250 and the back sheet 210 changes along different locations of the photovoltaic apparatus 1020. For example, at the location of the rigid folded portion 413, the back sheet 210 is spaced apart from the front sheet 250 by a first distance 1360F, and at locations away from the rigid folded portion 413, the back sheet 210 is spaced apart from the front sheet 250 by a second distance 1360L. The first distance 1360F is larger than the second distance 1360L because the front sheet 250 is supported by the supporting spacer 270 at the location of the rigid folded portion 413 preventing the front sheet 250 from bending towards the back sheet 210 during the lamination and/or folding process.

Figure 5:
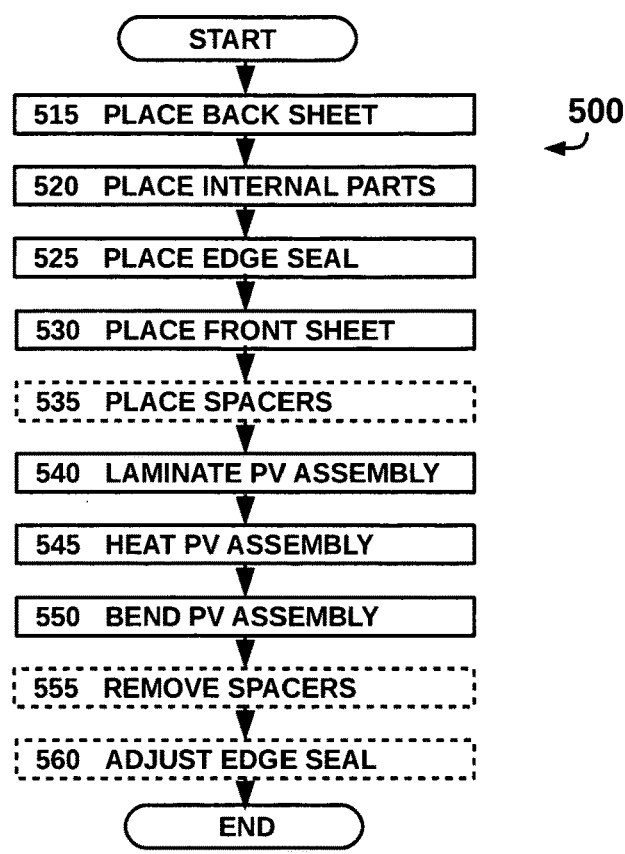
FIG. 5 is a process flow diagram of a method for forming the photovoltaic apparatus, according to one embodiment.

FIG. 5 is a process flow diagram of a method 500 for forming the photovoltaic apparatus 1020, according to one embodiment. At block 515, the back sheet 210 is provided. At block 520, the internal components of the photovoltaic apparatus 1020 are placed onto the back sheet 210. These internal components can include the back-side adhesive 230, the substrate 110, the photovoltaic device 100, the front-side adhesive 240, and the rovings 220. At block 525, the edge seal 260 is placed onto the back sheet 210 surrounding the internal components of the photovoltaic apparatus 1020. In some embodiments, the edge seal material is placed around areas which will contact the edges of the front sheet 250.

At block 530, the front sheet 250 is placed over the internal components of the photovoltaic apparatus 1020 and the edge seal 260 to form a photovoltaic assembly that can include the back sheet 210, the back-side adhesive 230, the substrate 110, the photovoltaic device 100, the front-side adhesive 240, and the edge seal 260. At block 535, one or more supporting spacers 270 can optionally be placed at the locations on the back sheet 210 of the photovoltaic assembly where the folded portions 413, 414 are to be formed. At block 540, the photovoltaic assembly can be laminated, for example by using the laminating sheet 2015 shown above in FIGS. 4C and 4D.

At block 545, the photovoltaic assembly can be heated before the folding process, for example by using the heating apparatus 4500 described above in reference to FIG. 4F. In some embodiments, the photovoltaic assembly may be heated to a temperature from about 75° C. to about 150° C., such as from about 100° C. to about 125° C. At block 550, the folding process is performed on the photovoltaic assembly to form one or more of the folded portions 413, 414 of the photovoltaic apparatus 1020, for example by using the back sheet roller assembly 4100 and the front sheet roller assembly 4200 as described above in reference to FIG. 4H. At block 555, any supporting spacers 270 that were optionally included may be removed. At block 560, an edge seal reshaping tool, such as the edge seal reshaping tool 3600 described above in reference to FIGS. 3A and 3B, may be used to reshape the edge seal to give the edge seal desired properties, such as the edge seal 360 including the overlap 362, the hump 363, and the ramp 364. Additional heat may also be applied during block 560 to facilitate reshaping the edge seal.

Figure 6A:
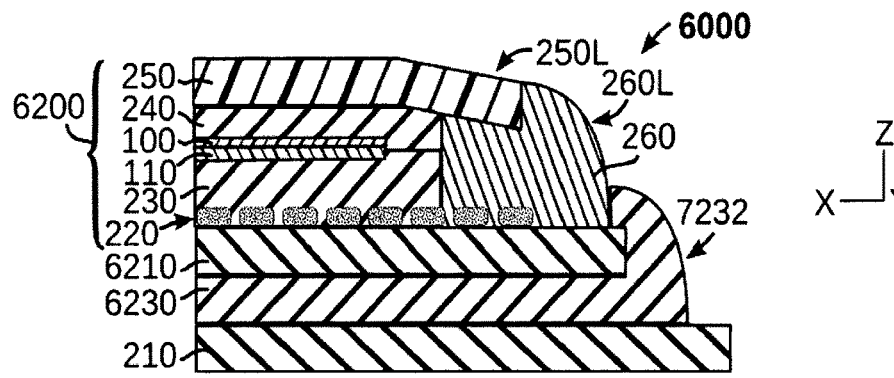
FIG. 6A is a side cross-sectional view of a photovoltaic apparatus, according to one embodiment.

FIG. 6A is a side cross-sectional view of a photovoltaic apparatus 6000, according to one embodiment. The photovoltaic apparatus 6000 includes folded portions similar to the folded portions 413, 414 described above in reference to the photovoltaic apparatus 1000. The view in FIG. 6A shows the layers of the photovoltaic apparatus 6000 away from the folded portions of the photovoltaic apparatus 6000 similar to the view of the photovoltaic apparatus 1000 shown in FIG. 1C. The photovoltaic apparatus 6000 includes all the components that were included in the photovoltaic apparatus 1000 described above, and additionally includes an intermediate back sheet 6210 and a back sheet adhesive 6230. The intermediate back sheet 6210 can serve as a barrier layer and may be formed of a material, such as a metal (e.g., aluminum), polymer, or fiber-reinforced polymer. The intermediate back sheet 6210 can be more flexible than the back sheet 210 and can also be thinner in the Z-direction (stacked direction) than the back sheet 210. The back sheet adhesive 6230 can be formed of a double-sided adhesive, a resin-based material, or a thermoplastic adhesive. The back sheet adhesive 6230 can include in excess portion that extends from the back sheet 210 over the outer edges of the intermediate back sheet 6210 and to the edge seal 260 forming a seal with the edge seal 260.

The intermediate back sheet 6210 and all the components of the photovoltaic apparatus 6000 above the intermediate back sheet 6010 in the Z-direction are hereinafter referred to as the photovoltaic assembly 6200. The intermediate back sheet 6210 allows for all the components of the photovoltaic assembly 6200 above the intermediate back sheet 6210 in the Z-direction to be placed on the intermediate back sheet 6210 before any of the components are placed on the back sheet 210 allowing for separate processing of the back sheet 210. For example, the back sheet 210, formed of a less flexible and thicker material than the intermediate back sheet 6210, can be folded before the other components of the photovoltaic apparatus 6000 are placed on the back sheet 210. Furthermore, the other components of the photovoltaic assembly 6200 above the intermediate back sheet 6210 in the Z-direction can be laminated onto the intermediate back sheet 6210 before placing the photovoltaic assembly 6200 on the back sheet 210.

Figure 6B:
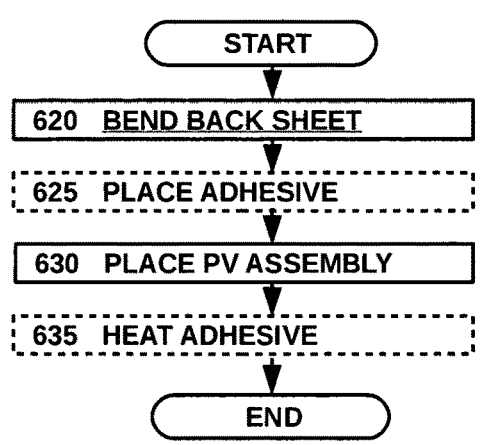
FIG. 6B is a process flow diagram of a method for forming the photovoltaic apparatus of FIG. 6A, according to one embodiment.

FIG. 6B is a process flow diagram of a method 600 for forming the photovoltaic apparatus 6000 of FIG. 6A, according to one embodiment. At block 620, the back sheet 210 is folded at opposing sides of the back sheet 210 to give the back sheet 210 a shape similar to the shape of the back sheet 210 shown in FIG. 1A. Folding the back sheet 210 in this way allows for the busbars 170, 180 (not shown) to be placed on areas of the photovoltaic apparatus 6000 that receive little to no light and increase the proportion of a supporting structure's surface area (e.g., surface area of a roof) that can be used to produce energy when multiple photovoltaic apparatuses are placed next to each other. In some embodiments, a plate bending roller assembly can be used to create the folds and the back sheet 210. At block 625, the back sheet adhesive 6230 can optionally be placed on the back sheet 210. At block 630, the photovoltaic assembly 6200 can be placed on the back sheet adhesive 6230. However, in some embodiments the photovoltaic assembly 6200 can be placed directly on the back sheet 210 if the back sheet adhesive 6230 is not used. In some embodiments, the back sheet adhesive 6230 may optionally be cured during block 630. At block 635, the photovoltaic apparatus 6000 is optionally heated to improve adhesion between the photovoltaic assembly 6200 and the back sheet 210 as well as adhesion between the back sheet 210 and the intermediate back sheet 6210 (when used). A laminator adapted to process curved plates can be used to heat the photovoltaic apparatus 6000 during block 635. The heat provided at block 635 can melt or partially melt one or more of the layers, such as the adhesive layers 230, 240 or the edge seal 260, to promote adhesion between the different layers in the photovoltaic apparatus 6000.

While the foregoing is directed to embodiments of the present disclosure, other and further embodiments of the disclosure may be devised without departing from the basic scope thereof, and the scope thereof is determined by the claims that follow.

What is claimed is:

1. A photovoltaic apparatus comprising:
a first portion having a light exposed surface facing in a first direction;
a second portion located in a different position in the first direction from the first portion;
a third portion located in a different position in the first direction from the first portion, wherein the second portion and the third portion both extend in a direction that is opposite to the first direction and are positioned below the light exposed surface of the first portion;
a front sheet and a back sheet each extending at least partially through each of the first portion, the second portion, and the third portion;
a first rigid folded portion connecting the first portion to the second portion, the first rigid folded portion including portions of the front sheet and the back sheet, wherein the first rigid folded portion is folded around a first folding axis that extends in a second direction that is perpendicular to the first direction;
a second rigid folded portion connecting the first portion to the third portion, the second rigid folded portion including portions of the front sheet and the back sheet, wherein the second rigid folded portion is folded around a second folding axis that extends in the second direction;

a first edge seal disposed between the front sheet and the back sheet at an edge of the second portion and a second edge seal disposed between the front sheet and the back sheet at an edge of the third portion, wherein the first edge seal is disposed at a distance from the light exposed surface in a direction that is opposite to the first direction and the second edge seal is disposed at a distance from the light exposed surface in a direction that is opposite to the first direction, wherein each of the first and the second edge seals comprise a polymeric material;

a thin-film photovoltaic device disposed between the front sheet and the back sheet, the thin-film photovoltaic device comprising:
an array of monolithically interconnected photovoltaic cells; and
one or more monolithic serial interconnects, between a first photovoltaic cell and a second photovoltaic cell in the array of monolithically interconnected photovoltaic cells, that extends in the second direction, wherein
at least a portion of the thin-film photovoltaic device is positioned within the first portion, and the portion of the thin-film photovoltaic device positioned within the first portion has a light receiving surface that is facing in the first direction,
at least a portion of the thin-film photovoltaic device is positioned within the second portion, and
at least one of the one or more monolithic serial interconnects is disposed within one or more of the first rigid folded portion and the second rigid folded portion; and a first busbar disposed on a surface of the thin-film photovoltaic device that is disposed in the second portion, and is electrically connected to the thin-film photovoltaic device.

2. The photovoltaic apparatus of claim 1, wherein
the second portion is spaced apart from the third portion in a second direction;
the first portion has a width in the second direction; and
the back sheet in the first portion does not distort in a vertical direction by more than 5% of the width of the first portion when the back sheet in the second portion and the back sheet in the third portion are placed on a flat horizontal surface and no external vertical support is provided to any portion of the back sheet in the first portion.

3. The photovoltaic apparatus of claim 1, wherein the first rigid folded portion consists of a portion of the back sheet, a portion of the front sheet, and one or more module components disposed between the portion of the back sheet and the portion of the front sheet.

4. The photovoltaic apparatus of claim 1, wherein the first busbar is disposed entirely within the second portion.

5. The photovoltaic apparatus of claim 4, further comprising a second busbar disposed entirely in the third portion and electrically connected to the thin-film photovoltaic device.

6. The photovoltaic apparatus of claim 1, wherein the light exposed surface is flat and the second portion and the third portion are at an angle to the light exposed surface.

7. The photovoltaic apparatus of claim 1, further comprising an intermediate back sheet disposed between the thin-film photovoltaic device and the back sheet.

8. The photovoltaic apparatus of claim 7, wherein the back sheet, the intermediate back sheet, and the thin-film photovoltaic device are arranged relative to each other in a stacked direction, and the intermediate back sheet is more flexible than the back sheet and thinner than the back sheet in the stacked direction.

9. A photovoltaic apparatus comprising:
a first photovoltaic module and a second photovoltaic module, each photovoltaic module comprising:
a first portion having a light exposed surface facing in a first direction;
a second portion located in a different position in the first direction from the first portion;
a third portion located in a different position in the first direction from the first portion, wherein the second portion and the third portion both extend in a direction that is opposite to the first direction and are positioned below the light exposed surface of the first portion;
a front sheet and a back sheet each extending at least partially through each of the first portion, the second portion, and the third portion;
a first rigid folded portion connecting the first portion to the second portion, the first rigid folded portion including portions of the front sheet and the back sheet, wherein the first rigid folded portion is folded around a first folding axis that extends in a second direction that is perpendicular to the first direction;
a second rigid folded portion connecting the first portion to the third portion, the second rigid folded portion including portions of the front sheet and the back sheet, wherein the second rigid folded portion is folded around a second folding axis that extends in the second direction;
a first edge seal disposed between the front sheet and the back sheet at an edge of the second portion and a second edge seal disposed between the front sheet and the back sheet at an edge of the third portion, wherein the first edge seal is disposed at a distance from the light exposed surface in the second direction and the second edge seal is disposed at a distance from the light exposed surface in the second direction, wherein each of the first and the second edge seals comprise a polymeric material;
a thin-film photovoltaic device disposed between the front sheet and the back sheet, the thin-film photovoltaic device comprising:
an array of monolithically interconnected photovoltaic cells; and
one or more monolithic serial interconnects, between a first photovoltaic cell and a second photovoltaic cell in the array of monolithically interconnected photovoltaic cells, that extends in the second direction, wherein
a light-exposed side of the thin-film photovoltaic device is facing in the first direction,
at least a portion of the thin-film photovoltaic device is positioned within the first portion, and the portion of the thin-film photovoltaic device positioned within the first portion has a light receiving surface that is facing in the first direction, and
at least a portion of the thin-film photovoltaic device is positioned within the second portion and the third portion, and
the thin-film photovoltaic device includes an array of monolithically interconnected photovoltaic cells that are separated from each other by a monolithic serial interconnect of the one or more monolithic serial interconnects;

at least one of the one or more monolithic serial interconnects is disposed within one or more of the first rigid folded portion and the second rigid folded portion;
a first busbar disposed on a surface of the thin-film photovoltaic device that is disposed in the second portion and is electrically connected to the thin-film photovoltaic device; and
a second busbar disposed on the surface of the thin-film photovoltaic device that is disposed in the third portion and is electrically connected to the thin-film photovoltaic device.

10. The photovoltaic apparatus of claim 9, wherein for each photovoltaic module,
the second portion is spaced apart from the third portion in a second direction;
the first portion has a width in the second direction; and
the back sheet in the first portion does not distort in a vertical direction by more than 5% of the width of the first portion when the back sheet in the second portion and the back sheet in the third portion are placed on a flat horizontal surface and no external vertical support is provided to any portion of the back sheet in the first portion.

11. The photovoltaic apparatus of claim 9, wherein for each photovoltaic module, the first rigid folded portion consists of a portion of the back sheet, a portion of the front sheet, and one or more module components disposed between the portion of the back sheet and the portion of the front sheet.

12. The photovoltaic apparatus of claim 9, wherein the third portion of the first photovoltaic module faces the second portion of the second photovoltaic module, and further comprises the first edge seal disposed at an edge along the first rigid folded portion, and the second edge seal disposed at an edge along the second rigid folded portion.

13. The photovoltaic apparatus of claim 9, wherein for each photovoltaic module, the first busbar is disposed entirely within the second portion and the second busbar is disposed entirely in the third portion.

14. The photovoltaic apparatus of claim 9, wherein front sheet of the second portion of the first photovoltaic module contacts the front sheet of the first portion of the second photovoltaic module.

15. A method of forming a photovoltaic apparatus, the method comprising:
forming a photovoltaic assembly having a first portion, a second portion, and a third portion, wherein the first portion has a light exposed surface facing in a first direction, the second portion is located in a different position in the first direction from the first portion, the third portion is located in a different position in the first direction from the first portion, and the second portion and the third portion extend in a direction that is opposite to the first direction, comprising:
placing a thin-film photovoltaic device comprising an array of monolithically interconnected photovoltaic cells over a back sheet;
forming one or more monolithic serial interconnects that extend in a second direction that is perpendicular to the first direction, wherein each of the one or more monolithic serial interconnects is disposed between adjacent monolithically interconnected photovoltaic cells in the array of monolithically interconnected photovoltaic cells;
placing a first busbar at a first end of the thin-film photovoltaic device;
placing a second busbar at a second end of the thin-film photovoltaic device, and
placing a front sheet over the thin-film photovoltaic device; and
bending the photovoltaic assembly to form a first rigid folded portion and a second rigid folded portion around a folding axis that extends in the second direction, wherein
the first rigid folded portion connects the first portion of the photovoltaic assembly to the second portion of the photovoltaic assembly,
the second rigid folded portion connects the first portion of the photovoltaic assembly to a third portion of the photovoltaic assembly,
at least a portion of the first busbar is disposed on a surface of the thin-film photovoltaic device that is disposed in the second portion,
at least a portion of the second busbar is disposed on a the surface of the thin-film photovoltaic device that is disposed in the third portion,
at least one of the one or more monolithic serial interconnects is disposed within one or more of the first rigid folded portion and the second rigid folded portion, and
a first edge seal is disposed between the front sheet and the back sheet at an edge of the second portion and a second edge seal is disposed between the front sheet and the back sheet at an edge of the third portion, wherein the first edge seal is disposed at a distance from the light exposed surface in the second direction and the second edge seal is disposed at a distance from the light exposed surface in the second direction, wherein each of the first and the second edge seals comprise a polymeric material.

16. The method of claim 15, further comprising heating the photovoltaic assembly to a temperature from about 40° C. to about 150° C. prior to bending the photovoltaic assembly.

17. The method of claim 15, further comprising
placing a supporting spacer on a first location of the back sheet prior to bending the photovoltaic assembly; and
laminating the photovoltaic assembly with a laminating sheet contacting the front sheet and the supporting spacer prior to bending the photovoltaic assembly, wherein the first rigid folded portion formed during the bending of the photovoltaic assembly includes the first location on the back sheet.

18. The method of claim 15, wherein the first busbar is disposed entirely within the second portion and the second busbar is disposed entirely within the third portion.

19. The photovoltaic apparatus of claim 1, wherein
a first external angle is formed between the second portion and a plane that is parallel to the light exposed surface of the first portion, and the first external angle is greater than 85°, and
a second external angle is formed between the third portion and the plane that is parallel to the light exposed surface of the first portion, and the second external angle is greater than 85°.

20. The photovoltaic apparatus of claim 1, wherein
the first rigid folded portion has a radius of curvature of between 5 mm and 30 cm, and
the second rigid folded portion has a radius of curvature of between 5 mm and 30 cm.

21. The photovoltaic apparatus of claim 9, wherein
a first external angle is formed between the second portion and a plane that is parallel to the light exposed surface of the first portion, and the first external angle is greater than 85°, and
a second external angle is formed between the third portion and the plane that is parallel to the light exposed surface of the first portion, and the second external angle is greater than 85°.

22. The photovoltaic apparatus of claim 9, wherein
the first rigid folded portion has a radius of curvature of between 5 mm and 30 cm, and
the second rigid folded portion has a radius of curvature of between 5 mm and 30 cm.

23. The method of claim 15, wherein
a first external angle is formed between the second portion and a plane that is parallel to the light exposed surface of the first portion, and the first external angle is greater than 85°, and
a second external angle is formed between the third portion and the plane that is parallel to the light exposed surface of the first portion, and the second external angle is greater than 85°.

24. The method of claim 15, wherein
the first rigid folded portion has a radius of curvature of between 5 mm and 30 cm, and
the second rigid folded portion has a radius of curvature of between 5 mm and 30 cm.

25. A photovoltaic apparatus comprising:
a first portion having a light exposed surface facing in a first direction;
a second portion that is aligned at a first external angle to a plane that is aligned in a perpendicular orientation to the first direction, and the first external angle is greater than 85°,
a third portion that is aligned at a second external angle to the plane, and the second external angle is greater than 85°, wherein the second portion and the third portion both extend in a direction that is opposite to the first direction and are positioned below the light exposed surface of the first portion;
a front sheet and a back sheet each extending at least partially through each of the first portion, the second portion, and the third portion;
a first rigid folded portion connecting the first portion to the second portion, the first rigid folded portion including portions of the front sheet and the back sheet;
a second rigid folded portion connecting the first portion to the third portion, the second rigid folded portion including portions of the front sheet and the back sheet;
a first edge seal disposed between the front sheet and the back sheet at an edge of the second portion and a second edge seal disposed between the front sheet and the back sheet at an edge of the third portion, wherein the first edge seal is disposed at a distance from the light exposed surface in a second direction and the second edge seal is disposed at a distance from the light exposed surface in the second direction, wherein each of the first and the second edge seals comprise a polymeric material;
a thin-film photovoltaic device disposed between the front sheet and the back sheet, wherein
at least a portion of the thin-film photovoltaic device is positioned within the first portion, and the portion of the thin-film photovoltaic device positioned within the first portion has a light receiving surface that is facing in the first direction,
at least a portion of the thin-film photovoltaic device is positioned within the second portion, and
the thin-film photovoltaic device includes an array of thin-film photovoltaic cells; and
a first busbar disposed on a surface of the thin-film photovoltaic device that is disposed in the second portion, and is electrically connected to the thin-film photovoltaic device.

\* \* \* \* \*